United States Patent
Xu et al.

(10) Patent No.: US 11,251,903 B2
(45) Date of Patent: *Feb. 15, 2022

(54) METHOD AND CODING APPARATUS FOR PROCESSING INFORMATION USING A POLAR CODE

(71) Applicant: HUAWEI TECHNOLOGIES CO., LTD., Guangdong (CN)

(72) Inventors: Chen Xu, Hangzhou (CN); Rong Li, Hangzhou (CN); Gongzheng Zhang, Hangzhou (CN); Yue Zhou, Hangzhou (CN); Lingchen Huang, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 39 days.

This patent is subject to a terminal disclaimer.

(21) Appl. No.: 16/817,626

(22) Filed: Mar. 13, 2020

(65) Prior Publication Data

US 2020/0322086 A1 Oct. 8, 2020

Related U.S. Application Data

(63) Continuation of application No. 16/579,867, filed on Sep. 24, 2019, now Pat. No. 10,637,609, which is a
(Continued)

(30) Foreign Application Priority Data

Mar. 24, 2017 (CN) .......................... 201710184922.6

(51) Int. Cl.
*H04W 4/00* (2018.01)
*H04L 1/00* (2006.01)

(52) U.S. Cl.
CPC .......... *H04L 1/0043* (2013.01); *H04L 1/0054* (2013.01); *H04L 1/0064* (2013.01); *H04L 1/0068* (2013.01)

(58) Field of Classification Search
CPC ... H04L 1/0043; H04L 1/0054; H04L 1/0064; H04L 1/0068; H04L 1/0013;
(Continued)

(56) References Cited

U.S. PATENT DOCUMENTS

| 6,105,158 A | 8/2000 | Chen et al. |
| 6,507,927 B1 | 1/2003 | Kalliojärvi |

(Continued)

FOREIGN PATENT DOCUMENTS

| CN | 103368583 A | 10/2013 |
| CN | 105991227 A | 10/2016 |

(Continued)

OTHER PUBLICATIONS

Zte et al., "Further Consideration on Polar codes with maximum mother code size",3GPP TSG RAN WG1 Meeting#88bis R1-1704384,Spokane, USA, Apr. 3-7, 2017,total 24 pages.
(Continued)

*Primary Examiner* — Stephen M D Agosta
(74) *Attorney, Agent, or Firm* — Fish & Richardson P.C.

(57) ABSTRACT

Embodiments of this application provide an information processing method and a coding apparatus. An information bit sequence includes a K-bit information block. The information bit sequence is to be processed into an encoded bit sequence with a target code length M. For a given code rate R, when the length K of the information block is greater than a preset threshold, the information bit sequence is segmented into two or more segments. Each segment is polar encoded into an encoded subsequence. The encoded subsequence has a length that equals to a mother code length Ni,
(Continued)

and i=1, 2, . . . , p. Each of the p encoded subsequences is rate matched to obtain a rate-matched encoded subsequence. A rate-matched encoded subsequence i of the p rate-matched encoded subsequences has a code length Mi. The p rate-matched encoded subsequences are concatenated into an encoded bit sequence which has a code length M.

20 Claims, 13 Drawing Sheets

Related U.S. Application Data continuation of application No. PCT/CN2018/080394, filed on Mar. 24, 2018.

(58) Field of Classification Search
CPC ... H04L 1/0057; H04L 1/0071; H04L 1/0041; H04L 1/0061; H04L 1/0058; H04W 28/04; H04W 72/12; H04W 72/1231; H04W 72/005; H04W 72/042; H04W 72/0466; H04W 88/02; H03M 13/13; H03M 13/6362; H03M 13/09; H03M 13/618; H03M 13/2792; H03M 13/616; H03M 12/2906

See application file for complete search history.

(56) References Cited

U.S. PATENT DOCUMENTS

| | | | |
|---|---|---|---|
| 10,574,265 B2* | 2/2020 | Palgy | H03M 13/13 |
| 10,666,391 B2* | 5/2020 | Xu | H03M 13/13 |
| 2005/0091568 A1 | 4/2005 | Levy et al. | |
| 2006/0195752 A1 | 8/2006 | Walker et al. | |
| 2011/0044399 A1 | 2/2011 | Dowling et al. | |
| 2012/0054576 A1 | 3/2012 | Gross et al. | |
| 2014/0016571 A1 | 1/2014 | Yucek et al. | |
| 2014/0153654 A1 | 6/2014 | Vojcic et al. | |
| 2014/0208183 A1 | 7/2014 | Mahdavifar et al. | |
| 2015/0026543 A1 | 1/2015 | Li et al. | |
| 2015/0092886 A1 | 4/2015 | Ionita et al. | |
| 2015/0103947 A1 | 4/2015 | Shen et al. | |
| 2015/0194987 A1 | 7/2015 | Li et al. | |
| 2015/0249473 A1 | 9/2015 | Li et al. | |
| 2015/0295593 A1 | 10/2015 | Trifonov et al. | |
| 2015/0333769 A1 | 11/2015 | Jeong et al. | |
| 2015/0358113 A1 | 12/2015 | Callard et al. | |
| 2015/0381208 A1 | 12/2015 | Li et al. | |
| 2016/0013810 A1 | 1/2016 | Gross et al. | |
| 2016/0164629 A1 | 6/2016 | Ahn et al. | |
| 2016/0182187 A1 | 6/2016 | Kim et al. | |
| 2016/0218743 A1 | 7/2016 | Li et al. | |
| 2016/0285479 A1 | 9/2016 | El-Khamy et al. | |
| 2016/0294418 A1 | 10/2016 | Huang et al. | |
| 2016/0308644 A1 | 10/2016 | Shen et al. | |
| 2016/0352464 A1 | 12/2016 | Shen et al. | |
| 2017/0047947 A1 | 2/2017 | Hong et al. | |
| 2017/0111060 A1 | 4/2017 | Huang et al. | |
| 2017/0181104 A1 | 6/2017 | Jang et al. | |
| 2017/0338996 A1 | 11/2017 | Sankar et al. | |
| 2018/0198564 A1 | 7/2018 | Yang et al. | |
| 2018/0262214 A1 | 9/2018 | Hui | |
| 2019/0052418 A1 | 2/2019 | Li et al. | |
| 2019/0089380 A1 | 3/2019 | Shen et al. | |
| 2019/0140663 A1 | 5/2019 | Noh et al. | |
| 2019/0199480 A1 | 6/2019 | Kim et al. | |
| 2020/0295876 A1* | 9/2020 | Xu | H04L 1/0057 |
| 2020/0351009 A1* | 11/2020 | Zhang | H04L 1/0068 |

FOREIGN PATENT DOCUMENTS

| | | |
|---|---|---|
| CN | 106330389 A | 1/2017 |
| EP | 2849377 A1 | 3/2015 |
| EP | 3073642 A1 | 9/2016 |
| EP | 3098970 A1 | 11/2016 |
| RU | 2014114215 A | 10/2015 |
| WO | 2015123842 A1 | 8/2015 |
| WO | 2015123855 A1 | 8/2015 |
| WO | 2017025823 A1 | 2/2017 |

OTHER PUBLICATIONS

Huawei et al., "Details of the Polar code design",3GPP TSG RAN WG1 Meeting #87 R1-1611254,Reno, USA, Nov. 10-14, 2016,total 15 pages.

Huawei et al., "Polar codes—encoding and decoding",3GPP TSG RAN WG1 Meeting #xx R1-164039,Nanjing, China, May 23-27, 2016,total 7 pages.

Samsung, "Maximum Polar Code Size",3GPP TSG RAN WG1 #88 Athens, Greece, Feb. 13-17, 2017, R1-1703004, toatal 6pages.

ZTE, ZTE Microelectronics, "On construction of Polar codes",3GPP TSG RAN WG1 Meeting #88 Athens, Greece Feb. 13-17, 2017,R1-1703426,total 4pages.

Office Action issued in Indian Application No. 201937039365 dated Jan. 11, 2021, 6 pages.

* cited by examiner

METHOD AND CODING APPARATUS FOR PROCESSING INFORMATION USING A POLAR CODE

CROSS-REFERENCE TO RELATED APPLICATIONS

This application is a continuation of U.S. patent application Ser. No. 16/579,867, filed on Sep. 24, 2019, which is a continuation of International Application No. PCT/CN2018/080394, filed on Mar. 24, 2018. The International Application claims priority to Chinese Patent Application No. 201710184922.6, filed on Mar. 24, 2017. All of the aforementioned patent applications are hereby incorporated by reference in their entireties.

TECHNICAL FIELD

Embodiments of the present application relate to the communications field, and more specifically, to a polar coding method, a coding apparatus, a decoding method, and a decoding apparatus.

BACKGROUND

In a communications system, channel encoding is usually used to improve data transmission reliability, to ensure communication quality. A Polar code proposed by Turkish professor Arikan is the first good code that has been theoretically proved to be capable of achieving a Shannon capacity and that has low encoding and decoding complexity. The polar code is a linear block code. An encoding matrix of the polar code is $G_N$, and an encoding process of the polar code is $x_1^N = u_1^N G_N$, where $u_1^N = (u_1, u_2, \ldots, u_N)$ is a binary row vector whose length is N (namely, a mother code length), $G_N$ is an N×N matrix, $G_N = F_2^{\otimes (\log_2(N))}$, and $F_2^{\otimes (\log_2(N))}$ is defined as a Kronecker product of $\log_2 N$ matrices $F_2$.

The matrix $F_2$ is:

$$F_2 = \begin{bmatrix} 1 & 0 \\ 1 & 1 \end{bmatrix}.$$

In the encoding process of the polar code, some bits in $u_1^N$ are used to carry information and are referred to as information bits, and a set of indexes of these bits is denoted as A. Other bits are set to a fixed value pre-agreed on by a receiving device (referred to as receiving end hereinafter) and a transmitting device (referred as transmitting end hereinafter), and are referred to as fixed bits or frozen bits. A set of indexes of these bits is represented by $A^c$. $A^c$ is a complementary set of A. The encoding process of the polar code is equivalent to:

$$x_1^N = u_A G_N(A) \oplus u_{A^c} G_N(A^c).$$

Herein, $G_N(A)$ is a submatrix of $G_N$ and that is obtained based on rows corresponding to the indexes in the set A, and $G_N(A^c)$ is a submatrix of $G_N$ and that is obtained based on rows corresponding to the indexes in the set $A^c$. $u_A$ is a set of the information bits in $u_1^N$, and a quantity of the information bits is K. $u_{A^c}$ is a set of the fixed bits in $u_1^N$, and a quantity of the fixed bits is (N−K). The fixed bits are known bits. These fixed bits are usually set to 0. However, the fixed bits can be set to any value provided that the value is pre-agreed on by the receiving end and the transmitting end.

When the fixed bits are set to 0, an encoding output of the polar code may be simplified as:

$$x_1^N = u_A G_N(A),$$

in which $G_N(A)$ is a K×N matrix.

A polar code construction process is a process of selecting the set A. This determines performance of the polar code. The polar code construction process is usually: determining, based on the mother code length N, that there are a total of N polar channels respectively corresponding to N rows of the encoding matrix, calculating reliabilities of the polar channels, using indexes of the first K polar channels with relatively high reliabilities as elements in the set A, and using indexes of remaining (N−K) polar channels as elements in the index set $A^c$ of the fixed bits. Positions of the information bits are determined based on the set A, and positions of the fixed bits are determined based on the set $A^c$.

It can be learned from the encoding matrix that a code length N of an original polar code (a mother code) is an integer power of 2, and in actual applications, a polar code with any code length is obtained by performing a rate matching on the mother code.

Currently, there are three rate matching schemes for the polar code: puncturing, shortening, and repetition. In the first two schemes, it is determined that a mother code length N, which is an integer power of 2, is greater than a target code length M, puncturing or shortening positions are determined according to a preset rule, and encoded bits at corresponding positions are removed, so as to achieve a rate matching. Before decoding, log-likelihood ratio (LLR) at the corresponding positions is restored according to a predetermined rule, to implement de-rate matching.

In order to achieve a balance between encoding performance and complexity, a repetition-based rate matching scheme may be determined, according to an agreed rule, for use in a communications system. A polar code encoded by using a mother code length is repeated to obtain a target code length that is greater than the mother code length, thereby implementing rate matching of the polar code. A difference of repetition from puncturing or shortening lies in that, an encoded bit sequence having the mother code length is repeatedly sent in a specific order until the target code length is reached, to implement rate matching. At a decoder side, LLRs at repetition positions are superimposed to implement de-rate matching, and decoding is performed by using the determined mother code length. Rate matching implemented in a repetition manner can lower decoding complexity, and reduce latency and a hardware implementation area. However, in some cases, repetition causes a particular performance loss to the polar code.

SUMMARY

Embodiments of this application provide a coding method, a coding apparatus, a decoding method, and a decoding apparatus, to reduce use times of a repetition-based rate matching scheme, and reduce a performance loss caused by repetition.

According to a first aspect, a polar coding method is provided, including:
  obtaining a to-be-sent information block and a target code length M of a polar code;
  determining a mother code length N used for polar encoding;
  when the target code length M is greater than N, if an encoding parameter of the information block meets a preset condition, segmenting a to-be-encoded information bit sequence into p subsegments, and performing independent polar encoding on the p subsegments, to obtain p encoded bit sequences whose lengths are respectively mother code lengths of the subsegments, where p is an integer greater than or equal to 2;

separately performing rate matching on p encoding results, to obtain p encoded bit sequences whose lengths are respectively target code lengths of the subsegments; and combining the p rate-matched encoded bit sequences, to obtain an encoded bit sequence whose length is M.

In a first possible implementation of the first aspect, the method further includes:

if the encoding parameter of the information block does not meet the preset condition, performing polar encoding on the to-be-encoded information bit sequence by using the mother code length N, to obtain a first encoded bit sequence whose length is N, and repeating at least some bits in the first encoded bit sequence, to obtain an encoded bit sequence whose length is M.

In a second possible implementation of the first aspect, the method further includes:

if the target code length M is less than or equal to the mother code length N, performing polar encoding on the to-be-encoded information bit sequence by using the mother code length N, to obtain a second encoded bit sequence, and shortening or puncturing the second encoded bit sequence, to obtain an encoded bit sequence whose length is M.

With reference to any one of the first aspect and all the foregoing possible implementations of the first aspect, in a third possible implementation of the first aspect, a total length of the to-be-encoded information bit sequence is Kc, information bit lengths of the p subsegments are respectively K1, K2, . . . , Kp, the mother code lengths used for performing independent polar encoding on the p subsegments are respectively N1, N2, . . . , Np, corresponding target code lengths are respectively M1, M2, . . . , Mp, Kc=K1+K2+ . . . +Kp, M=M1+M2+ . . . +Mp, the to-be-encoded information bit sequence includes the information block, and Kc is greater than or equal to a length K of the information block; and the method includes:

for each Mi, if a target code length Mi of a subsegment corresponding to Mi is greater than a mother code length Ni, and an encoding parameter of a subsegment corresponding to Ki meets the preset condition, further segmenting the subsegment corresponding to Mi into p subsegments, performing independent encoding and rate matching on the p subsegments, to obtain p corresponding encoded bit sequences, and combining the p encoded bit sequences, to obtain an encoded bit sequence whose target code length is Mi, where i=1, 2, . . . , p.

With reference to the third possible implementation of the first aspect, in a fourth possible implementation of the first aspect, the method includes:

if the target code length Mi is greater than the mother code length Ni, and the encoding parameter of the subsegment corresponding to Mi does not meet the preset condition, performing, by using the mother code length Ni, polar encoding on the subsegment corresponding to Mi, to obtain a third encoded bit sequence whose length is Ni, and repeating at least some bits in the third encoded bit sequence, to obtain an encoded bit sequence whose length is Mi; or if the target code length Mi is less than or equal to the mother code length Ni, performing, by using the mother code length Ni, polar encoding on the subsegment corresponding to Ki, to obtain a fourth encoded bit sequence, and shortening or puncturing the fourth encoded bit sequence, to obtain an encoded bit sequence whose length is Mi.

According to a second aspect, a coding apparatus is provided, including:

an obtaining unit, configured to obtain a to-be-sent information block and a target code length M of a polar code;

an encoding unit, configured to: determine a mother code length N used for polar encoding, when the target code length M is greater than N, if an encoding parameter of the information block meets a preset condition, segment a to-be-encoded information bit sequence into p subsegments, and perform independent polar encoding on the p subsegments, to obtain p encoded bit sequences whose lengths are respectively mother code lengths of the subsegments, where p is an integer greater than or equal to 2;

a rate matching unit, configured to separately perform rate matching on p encoding results, to obtain p encoded bit sequences whose lengths are respectively target code lengths of the subsegments; and a combination unit, configured to combine the p rate-matched encoded bit sequences, to obtain an encoded bit sequence whose length is M.

In a first possible implementation of the second aspect, the encoding unit is configured to: if the encoding parameter of the information block does not meet the preset condition, perform polar encoding on the to-be-encoded information bit sequence by using the mother code length N, to obtain a first encoded bit sequence whose length is N; and the rate matching unit is configured to repeat at least some bits in the first encoded bit sequence, to obtain an encoded bit sequence whose length is M.

In a second possible implementation of the second aspect, the encoding unit is configured to: if the target code length M is less than or equal to the mother code length N, perform polar encoding on the to-be-encoded information bit sequence by using the mother code length N, to obtain a second encoded bit sequence; and the rate matching unit is configured to shorten or puncture the second encoded bit sequence, to obtain an encoded bit sequence whose length is M.

With reference to any one of the second aspect and all the foregoing possible implementations of the second aspect, in a third possible implementation of the second aspect, the encoding unit is configured to: if a target code length Mi is greater than a mother code length Ni, and an encoding parameter of a subsegment corresponding to Mi does not meet the preset condition, perform, by using the mother code length Ni, polar encoding on the subsegment corresponding to Mi, to obtain a third encoded bit sequence whose length is Ni; and the rate matching unit is configured to repeat at least some bits in the third encoded bit sequence, to obtain an encoded bit sequence whose length is Mi; or the encoding unit is configured to: if a target code length Mi is less than or equal to a mother code length Ni, perform, by using the mother code length Ni, polar encoding on a subsegment corresponding to Ki, to obtain a fourth encoded bit sequence; and the rate matching unit is configured to shorten or puncture the fourth encoded bit sequence, to obtain an encoded bit sequence whose length is Mi.

According to a third aspect, another coding apparatus is provided, including:

a memory, configured to store a program; and a processor, configured to: execute the program stored in the memory, and when the program is executed, obtain a to-be-sent information block and a target code length M of a polar code; determine a mother code length N used for polar encoding, when the target code length M is greater than N, if an encoding parameter of the information block meets a preset condition, segment a to-be-encoded information bit sequence into p subsegments, and perform independent polar encoding on the p subsegments, to obtain p encoded bit sequences whose lengths are respectively mother code lengths of the subsegments, where p is an integer greater than or equal to 2; separately perform rate matching on p encoding results, to obtain p encoded bit sequences whose lengths are respectively target code lengths of the subsegments; and combine the p rate-matched encoded bit sequences, to obtain an encoded bit sequence whose length is M.

In a first possible implementation of the third aspect, the processor is configured to: if the encoding parameter of the information block does not meet the preset condition, perform polar encoding on the to-be-encoded information bit sequence by using the mother code length N, to obtain a first encoded bit sequence whose length is N, and repeat at least some bits in the first encoded bit sequence, to obtain an encoded bit sequence whose length is M.

In a second possible implementation of third first aspect, the processor is configured to: if the target code length M is less than or equal to the mother code length N, perform polar encoding on the to-be-encoded information bit sequence by using the mother code length N, to obtain a second encoded bit sequence, and shorten or puncture the second encoded bit sequence, to obtain an encoded bit sequence whose length is M.

With reference to any one of the third aspect and all the foregoing possible implementations of the third aspect, in a third possible implementation of the third aspect, a total length of the to-be-encoded information bit sequence is Kc, information bit lengths of the p subsegments are respectively K1, K2, . . . , Kp, the mother code lengths used for performing independent polar encoding on the p subsegments are respectively N1, N2, . . . , Np, corresponding target code lengths are respectively M1, M2, . . . , Mp, Kc=K1+K2+ . . . +Kp, M=M1+M2+ . . . +Mp, the to-be-encoded information bit sequence includes the information block, and Kc is greater than or equal to a length K of the information block; and the processor is configured to: for each Mi, if a target code length Mi of a subsegment corresponding to Mi is greater than a mother code length Ni, and an encoding parameter of a subsegment corresponding to Ki meets the preset condition, further segment the subsegment corresponding to Mi into p subsegments, perform independent encoding and rate matching on the p subsegments, to obtain p corresponding encoded bit sequences, and combine the p encoded bit sequences, to obtain an encoded bit sequence whose target code length is Mi, where i=1, 2, . . . , p.

According to a fourth aspect, still another coding apparatus is provided, including:
at least one input end, configured to receive an information block; a signal processor, configured to: obtain a to-be-sent information block and a target code length M of a polar code; determine a mother code length N used for polar encoding, when the target code length M is greater than N, if an encoding parameter of the information block meets a preset condition, segment a to-be-encoded information bit sequence into p subsegments, and perform independent polar encoding on the p subsegments, to obtain p encoded bit sequences whose lengths are respectively mother code lengths of the subsegments, where p is an integer greater than or equal to 2; separately perform rate matching on p encoding results, to obtain p encoded bit sequences whose lengths are respectively target code lengths of the subsegments; and combine the p rate-matched encoded bit sequences, to obtain an encoded bit sequence whose length is M; and at least one output end, configured to output the encoded bit sequence obtained by the signal processor.

In a first possible implementation of the fourth aspect, the signal processor is configured to: if the encoding parameter of the information block does not meet the preset condition, perform polar encoding on the to-be-encoded information bit sequence by using the mother code length N, to obtain a first encoded bit sequence whose length is N, and repeat at least some bits in the first encoded bit sequence, to obtain an encoded bit sequence whose length is M.

In a second possible implementation of fourth aspect, the signal processor is configured to: if the target code length M is less than or equal to the mother code length N, perform polar encoding on the to-be-encoded information bit sequence by using the mother code length N, to obtain a second encoded bit sequence, and shorten or puncture the second encoded bit sequence, to obtain an encoded bit sequence whose length is M.

With reference to any one of the fourth aspect and all the foregoing possible implementations of the fourth aspect, in a third possible implementation of the fourth aspect, a total length of the to-be-encoded information bit sequence is Kc, information bit lengths of the p subsegments are respectively K1, K2, . . . , Kp, the mother code lengths used for performing independent polar encoding on the p subsegments are respectively N1, N2, . . . , Np, corresponding target code lengths are respectively M1, M2, . . . , Mp, Kc=K1+K2+ . . . +Kp, M=M1+M2+ . . . +Mp, the to-be-encoded information bit sequence includes the information block, and Kc is greater than or equal to a length K of the information block; and the signal processor is configured to: for each Mi, if a target code length Mi of a subsegment corresponding to Mi is greater than a mother code length Ni, and an encoding parameter of a subsegment corresponding to Ki meets the preset condition, further segment the subsegment corresponding to Mi into p subsegments, perform independent encoding and rate matching on the p subsegments, to obtain p corresponding encoded bit sequences, and combine the p encoded bit sequences, to obtain an encoded bit sequence whose target code length is Mi, where i=1, 2, . . . , p.

According to a fifth aspect, a polar code decoding method is provided, including:
receiving log-likelihood ratios LLRs corresponding to to-be-decoded bits, where a length of the to-be-decoded bits is a target code length M used in polar encoding; determining a mother code length N used in polar encoding, when the target code length M is greater than the mother code length N, if an encoding parameter meets a preset condition, segmenting the LLRs corresponding to the to-be-decoded bits into p subsegments, and separately performing de-rate matching on the p subsegments, where p is an integer greater than or equal to 2; performing independent SCL (successive cancellation list) decoding on LLRs of p de-rate-matched subsegments, to obtain decoding results of the p subsegments; and combining the decoding results of the p subsegments, to output a decoded bit sequence.

In a first possible implementation of the fifth aspect, mother code lengths used for encoding the p subsegments are respectively N1, N2, Np, target code lengths are respectively M1, M2, . . . , Mp, and corresponding information bit lengths are K1, K2, . . . , Kp; and the method includes: for each Mi, where i=1, 2, . . . , p, if Mi is greater than a mother code length Ni, and an encoding parameter of a subsegment corresponding to Mi meets the preset condition, further segmenting an LLR sequence of the subsegment corresponding to Mi into p subsegments, separately performing de-rate matching and decoding on the p subsegments, to obtain corresponding decoding results of the p subsegments, and combining the decoding results of the p subsegments, to obtain Ki corresponding information bits; or for each Mi, where i=1, 2, . . . , p, if Mi is greater than a mother code length Ni, and an encoding parameter of a subsegment corresponding to Mi does not meet the preset condition, superimposing LLRs at repetition positions, to obtain a de-rate-matched LLR sequence whose length is Ni, and decoding the LLR sequence, to obtain a decoding result of the subsegment corresponding to Mi.

In a second possible implementation of the fifth aspect, the method includes: when the target code length M is less than the mother code length N, restoring an LLR at a puncturing or shortening position, to obtain a de-rate-matched LLR sequence whose length is N, and decoding the LLR sequence, to obtain a decoded bit sequence.

According to a sixth aspect, a decoding apparatus is provided, including:

a receiving unit, configured to receive log-likelihood ratios LLRs corresponding to to-be-decoded bits, where a length of the to-be-decoded bits is a target code length M used in polar encoding; a de-rate matching unit, configured to: determine a mother code length N used in polar encoding, when the target code length M is greater than the mother code length N, if an encoding parameter meets a preset condition, segment the LLRs corresponding to the to-be-decoded bits into p subsegments, and separately perform de-rate matching on the p subsegments, where p is an integer greater than or equal to 2; a decoding unit, configured to perform independent SCL decoding on LLRs of p subsegments, to obtain decoding results of the p subsegments; and an output unit, configured to combine the decoding results of the p subsegments, to output a decoded bit sequence.

In a first possible implementation of the sixth aspect, mother code lengths used for encoding the p subsegments are respectively N1, N2, . . . , Np, target code lengths are respectively M1, M2, . . . , Mp, and corresponding information bit lengths are K1, K2, . . . , Kp; and the de-rate matching unit is configured to: for each Mi, where i=1, 2, . . . , p, if Mi is greater than a mother code length Ni, and an encoding parameter of a subsegment corresponding to Mi meets the preset condition, further segment an LLR sequence of the subsegment corresponding to Mi into p subsegments, and separately perform de-rate matching on the p subsegments; the decoding unit is configured to decode LLRs of p de-rate-matched subsegments, to obtain corresponding decoding results of the p subsegments; and the combination unit is configured to combine the decoding results of the p subsegments, to obtain Ki corresponding information bits; or de-the rate matching unit is configured to: for each Mi, where i=1, 2, . . . , p, if Mi is greater than a mother code length Ni, and an encoding parameter of a subsegment corresponding to Mi does not meet the preset condition, superimpose LLRs that at repetition positions, to obtain a rate-matched LLR sequence whose length is Ni; and the decoding unit is configured to decode the LLR sequence whose length is Ni, to obtain a decoding result of the subsegment corresponding to Mi.

In a second possible implementation of the sixth aspect, the de-rate matching unit is configured to: when the target code length M is less than the mother code length N, restore an LLR at a puncturing or shortening position, to obtain a rate-matched LLR sequence whose length is N, and the decoding unit is configured to decode the LLR sequence whose length is N, to obtain a decoded bit sequence.

According to a seventh aspect, a decoding apparatus is provided, including:

a memory, configured to store a program; and a processor, configured to: execute the program stored in the memory, and when the program is executed, receive log-likelihood ratios LLRs corresponding to to-be-decoded bits, where a length of the to-be-decoded bits is a target code length M used in polar encoding; determine a mother code length N used in polar encoding, when the target code length M is greater than the mother code length N, if an encoding parameter meets a preset condition, segment the LLRs corresponding to the to-be-decoded bits into p subsegments, and separately perform de-rate matching on the p subsegments; perform independent SCL decoding on LLRs of p subsegments, to obtain decoding results of the p subsegments; and combine the decoding results of the p subsegments, to output a decoded bit sequence, where p is an integer greater than or equal to 2.

In a first possible implementation of the seventh aspect, mother code lengths used for encoding the p subsegments are respectively N1, N2, . . . , Np, target code lengths are respectively M1, M2, . . . , Mp, and corresponding information bit lengths are K1, K2, . . . , Kp; and the processor is configured to: for each Mi, where i=1, 2, . . . , p, if Mi is greater than a mother code length Ni, and an encoding parameter of a subsegment corresponding to Mi meets the preset condition, further segment an LLR sequence of the subsegment corresponding to Mi into p subsegments, separately perform de-rate matching and decoding on the p subsegments, to obtain corresponding decoding results of the p subsegments, and combine the decoding results of the p subsegments, to obtain Ki corresponding information bits; or the processor is configured to: for each Mi, where i=1, 2, . . . , p, if Mi is greater than a mother code length Ni, and an encoding parameter of a subsegment corresponding to Mi does not meet the preset condition, superimpose LLRs at repetition positions, to obtain a de-rate-matched LLR sequence whose length is Ni, and decode the LLR sequence, to obtain a decoding result of the subsegment corresponding to Mi.

In a second possible implementation of the seventh aspect, the processor is configured to: when the target code length M is less than the mother code length N, restore an LLR at a puncturing or shortening position, to obtain a de-rate-matched LLR sequence whose length is N, and decode the LLR sequence, to obtain a decoded bit sequence.

According to an eighth aspect, a decoding apparatus is provided, including:

at least one input end, configured to receive log-likelihood ratios (LLRs) corresponding to to-be-decoded bits, where a length of the to-be-decoded bits is a target code length M used in polar encoding; a signal processor, configured to: determine a mother code length N used in encoding, when the target code length M is greater than the mother code length N, if an encoding parameter meets a preset condition, segment the LLRs corresponding to the to-be-decoded bits into p subsegments, and separately perform de-rate matching on the p subsegments; perform independent SCL decoding on LLRs of p de-rate-matched subsegments, to obtain decoding results of the p subsegments; and combine the decoding results of the p subsegments, to output a decoded bit sequence, where p is an integer greater than or equal to 2; and at least one output end, configured to output the decoded bit sequence obtained by the signal processor.

In a first possible implementation of the eighth aspect, mother code lengths used for encoding the p subsegments are respectively N1, N2, ..., Np, target code lengths are respectively M1, M2, ..., Mp, and corresponding information bit lengths are K1, K2, ..., Kp; and the signal processor is configured to: for each Mi, where i=1, 2, ..., p, if Mi is greater than a mother code length Ni, and an encoding parameter of a subsegment corresponding to Mi meets the preset condition, further segment an LLR sequence of the subsegment corresponding to Mi into p subsegments, separately perform de-rate matching and decoding on the p subsegments, to obtain corresponding decoding results of the p subsegments, and combine the decoding results of the p subsegments, to obtain Ki corresponding information bits; or the signal processor is configured to: for each Mi, where i=1, 2, ..., p, if Mi is greater than a mother code length Ni, and an encoding parameter of a subsegment corresponding to Mi does not meet the preset condition, superimpose LLRs at repetition positions, to obtain a de-rate-matched LLR sequence whose length is Ni, and decode the LLR sequence, to obtain a decoding result of the subsegment corresponding to Mi.

In a second possible implementation of the eighth aspect, the signal processor is configured to: when the target code length M is less than the mother code length N, restore an LLR at a puncturing or shortening position, to obtain a de-rate-matched LLR sequence whose length is N, and decode the LLR sequence, to obtain a decoded bit sequence.

In any one of the foregoing aspects or implementations, the encoding parameter includes one of the following: a code rate R, the length Kc of the to-be-encoded information bit sequence, the length K of the information block, or the target code length M; and the preset condition includes any one of the following: for a given code rate R, the length Kc of the to-be-encoded information bit sequence is greater than a preset threshold; for a given code rate R, the length K of the information block is greater than a preset threshold; or for a given code rate R, the target code length M is greater than a preset threshold.

In any one of the foregoing aspects or implementations, the method includes: determining the mother code length $N=\min(2^{\lceil \log_2 M \rceil}, N_{max})$, where $\lceil \cdot \rceil$ indicates rounding up, $\min(\cdot)$ indicates a minimum value that is returned, and $N_{max}$ indicates a maximum system-supported mother code length.

That p=2, $N_{max}$=1024, and the polar encoding is PC-polar encoding is used as an example, and the preset condition is one of the following:

for R=1/12, the length Kc of the to-be-encoded information bit sequence is greater than a preset threshold Kc1, where Kc1 is an integer in an interval [330, 370];

for R=1/6, the length Kc of the to-be-encoded information bit sequence is greater than a preset threshold Kc2, where Kc2 is an integer in an interval [345, 365];

for R=1/4, the length Kc of the to-be-encoded information bit sequence is greater than a preset threshold Kc3, where Kc3 is an integer in an interval [370, 380];

for R=1/3, the length Kc of the to-be-encoded information bit sequence is greater than a preset threshold Kc4, where Kc4 is an integer in an interval [450, 460];

for R=2/5, the length Kc of the to-be-encoded information bit sequence is greater than a preset threshold Kc5, where Kc5 is an integer in an interval [500, 510];

for R=1/12, the length K of the information block is greater than a preset threshold Kt1, where Kt1 is an integer in an interval [314, 354];

for R=1/6, the length K of the information block is greater than a preset threshold Kt2, where Kt2 is an integer in an interval [329, 349];

for R=1/4, the length K of the information block is greater than a preset threshold Kt3, where Kt3 is an integer in an interval [354, 364];

for R=1/3, the length K of the information block is greater than a preset threshold Kt4, where Kt4 is an integer in an interval [434, 444];

for R=2/5, the length K of the information block is greater than a preset threshold Kt5, where Kt5 is an integer in an interval [484, 494];

for R=1/12, the target code length M is greater than a preset threshold Mt1, where Mt1 is an integer in an interval [3768, 4248];

for R=1/6, the target code length M is greater than a preset threshold Mt2, where Mt2 is an integer in an interval [1974, 2094];

for R=1/4, the target code length M is greater than a preset threshold Mt3, where Mt3 is an integer in an interval [1416, 1456];

for R=1/3, the target code length M is greater than a preset threshold Mt4, where Mt4 is an integer in an interval [1302, 1332]; or for R=2/5, the target code length M is greater than a preset threshold Mt5, where Mt5 is an integer in an interval [1210, 1235].

In an example, the foregoing threshold may be any one of the following: Kc1=360, Kc2=360, Kc3=380, Kc4=460, Kc5=510, Kt1=344, Kt2=344, Kt3=364, Kt4=444, Kt5=494, Mt1=4128, Mt2=2064, Mt3=1456, Mt4=1332, or Mt5=1235.

That p=2, $N_{max}$=1024, and the polar encoding is CA (CRC aided)-polar encoding is used as an example, and the preset condition is one of the following:

for R=1/12, the length Kc of the to-be-encoded information bit sequence is greater than a preset threshold Kc1, where Kc1 is an integer in an interval [310, 340];

for R=1/6, the length Kc of the to-be-encoded information bit sequence is greater than a preset threshold Kc2, where Kc2 is an integer in an interval [350, 365];

for R=1/4, the length Kc of the to-be-encoded information bit sequence is greater than a preset threshold Kc3, where Kc3 is an integer in an interval [410, 450];

for R=1/3, the length Kc of the to-be-encoded information bit sequence is greater than a preset threshold Kc4, where Kc4 is an integer in an interval [470, 495];

for R=2/5, the length Kc of the to-be-encoded information bit sequence is greater than a preset threshold Kc5, where Kc5 is an integer in an interval [520, 530];

for R=1/12, the length K of the information block is greater than a preset threshold Kt1, where Kt1 is an integer in an interval [291, 321];

for R=1/6, the length K of the information block is greater than a preset threshold Kt2, where Kt2 is an integer in an interval [331, 346];

for R=1/4, the length K of the information block is greater than a preset threshold Kt3, where Kt3 is an integer in an interval [391, 431];

for R=1/3, the length K of the information block is greater than a preset threshold Kt4, where Kt4 is an integer in an interval [451, 476];

for R=2/5, the length K of the information block is greater than a preset threshold Kt5, where Kt5 is an integer in an interval [501, 511];

for R=1/12, the target code length M is greater than a preset threshold Mt1, where Mt1 is an integer in an interval [3492, 3852];

for R=1/6, the target code length M is greater than a preset threshold Mt2, where Mt2 is an integer in an interval [1986, 2076];

for R=1/4, the target code length M is greater than a preset threshold Mt3, where Mt3 is an integer in an interval [1564, 1724];

for R=1/3, the target code length M is greater than a preset threshold Mt4, where Mt4 is an integer in an interval [1353, 1428]; or for R=2/5, the target code length M is greater than a preset threshold Mt5, where Mt5 is an integer in an interval [1253, 1278].

In an example, the foregoing threshold may be any one of the following: Kc1=320, Kc2=360, Kc3=430, Kc4=490, Kc5=530, Kt1=301, Kt2=341, Kt3=411, Kt4=471, Kt5=511, Mt1=3612, Mt2=2046, Mt3=1644, Mt4=1413, or Mt5=1278.

According to a ninth aspect, a communications apparatus is provided, including: a bus, a processor, a storage medium, a bus interface, a network adapter, a user interface, and an antenna.

The bus is configured to connect the processor, the storage medium, the bus interface, and the user interface.

The processor is configured to perform the coding method in the first aspect or any implementation of the first aspect, or configured to perform the decoding method in the fifth aspect or any implementation of the fifth aspect.

The storage medium is configured to store an operating system, and, to-be-sent data or received data.

The bus interface is connected to the network adapter.

The network adapter is configured to implement a signal processing function of a physical layer in a wireless communications network.

The user interface is configured to connect to a user input device.

The antenna is configured to send and receive a signal.

According to another aspect of this application, a computer readable storage medium is provided. The computer readable storage medium stores an instruction, and when the instruction runs on a computer, the computer is enabled to perform the methods according to the foregoing aspects.

According to still another aspect of this application, a computer program product including an instruction is provided, and when the computer program product runs on a computer, the computer is enabled to perform the methods according to the foregoing aspects.

According to yet another aspect of this application, a computer program is provided, and when the computer program runs on a computer, the computer is enabled to perform the methods according to the foregoing aspects.

In the embodiments of this application, when the target code length exceeds the mother code length determined according to an agreed rule, if the encoding parameter meets the preset condition, independent segmentation encoding is performed on the to-be-encoded information bit sequence, thereby decreasing a probability of using a repetition-based rate matching scheme, and reducing a performance loss caused by repetition.

DESCRIPTION OF EMBODIMENTS

Figure 1:
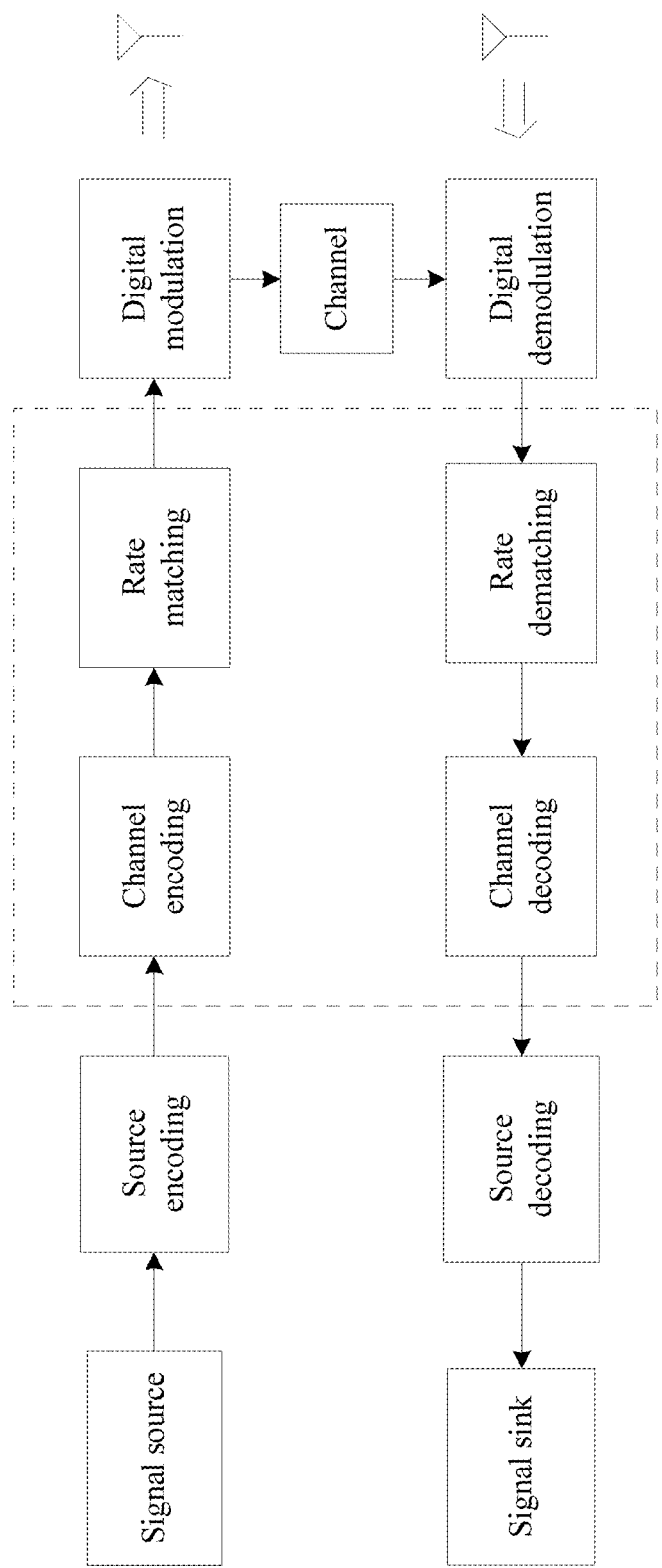
FIG. 1 is a schematic diagram of a basic procedure of wireless communication between a transmitting end and a receiving end.

FIG. 1 is a basic procedure of wireless communication. At a transmitting end, a signal is sent from a signal source after source encoding, channel encoding, and digital modulation are sequentially performed on the signal. At a receiving end, the signal is output to a signal sink after digital demodulation, channel decoding, and source decoding are sequentially performed on the signal. A polar code may be used for channel encoding/decoding. A code length of an original polar code (a mother code) is an integer power of 2. Therefore, during actual application, rate matching needs to be performed to implement a polar code with any code length. As shown in FIG. 1, at the transmitting end, rate matching is performed after the channel encoding, to implement any target code length; and at the receiving end, de-rate matching is performed before the channel decoding.

The technical solutions of the embodiments of this application may be applied to fifth generation (5G) communications systems, and may also be applied to other various communications systems, such as: global system for mobile communications (GSM), code division multiple access (CDMA) system, wideband code division multiple access (WCDMA) system, general packet radio service (GPRS), long term evolution (LTE) system, LTE frequency division duplex (FDD) system, LTE time division duplex (TDD) system, and universal mobile telecommunications system (UMTS).

In some cases, in a communications system, a mother code length is usually determined according to an agreed rule. When the determined mother code length is greater than a target code length, a shortening-based or puncturing-based rate matching scheme may be used to implement rate matching. When the determined mother code length is less than a target code length, a repetition-based rate matching scheme may be used to perform rate matching. However, the repetition-based scheme causes a performance loss. In some communications systems, a maximum mother code length used for a polar code may be further specified. For example, it is specified that a maximum downlink mother code length is 512 and a maximum uplink mother code length is 1024 in a communications system. Due to a limitation on a maximum mother code length used for polar code encoding, when the target code length is greater than $N_{max}$, simply sending a polar code with a code length $N_{max}$ repeatedly may cause a performance loss, and more repeated bits cause a larger loss.

Performing segmentation encoding and then combination on a polar code also causes a performance loss. However, under a particular condition (for example, when a mother code rate, namely, K/N, is relatively large), a coding gain brought by the segmentation encoding compensates, to some extent, for the loss caused by the segmentation encoding. Therefore, under a particular condition (for example, when a code rate of each segment in the segmentation encoding is greater than a specific mother code rate), performance in the segmentation encoding is better than that in the repetition-based rate matching scheme.

In this application, when an encoding parameter meets a preset condition, segmentation encoding is performed on to-be-encoded information bits, to reduce a polar code performance loss caused by an existing rate matching scheme (repetition). When a target code length M is less than a mother code length N, polar encoding may be performed based on the mother code length N, to obtain an encoded bit sequence whose length is N, and then puncturing or shortening is performed to obtain an encoded bit sequence whose length is M.

Figure 2:
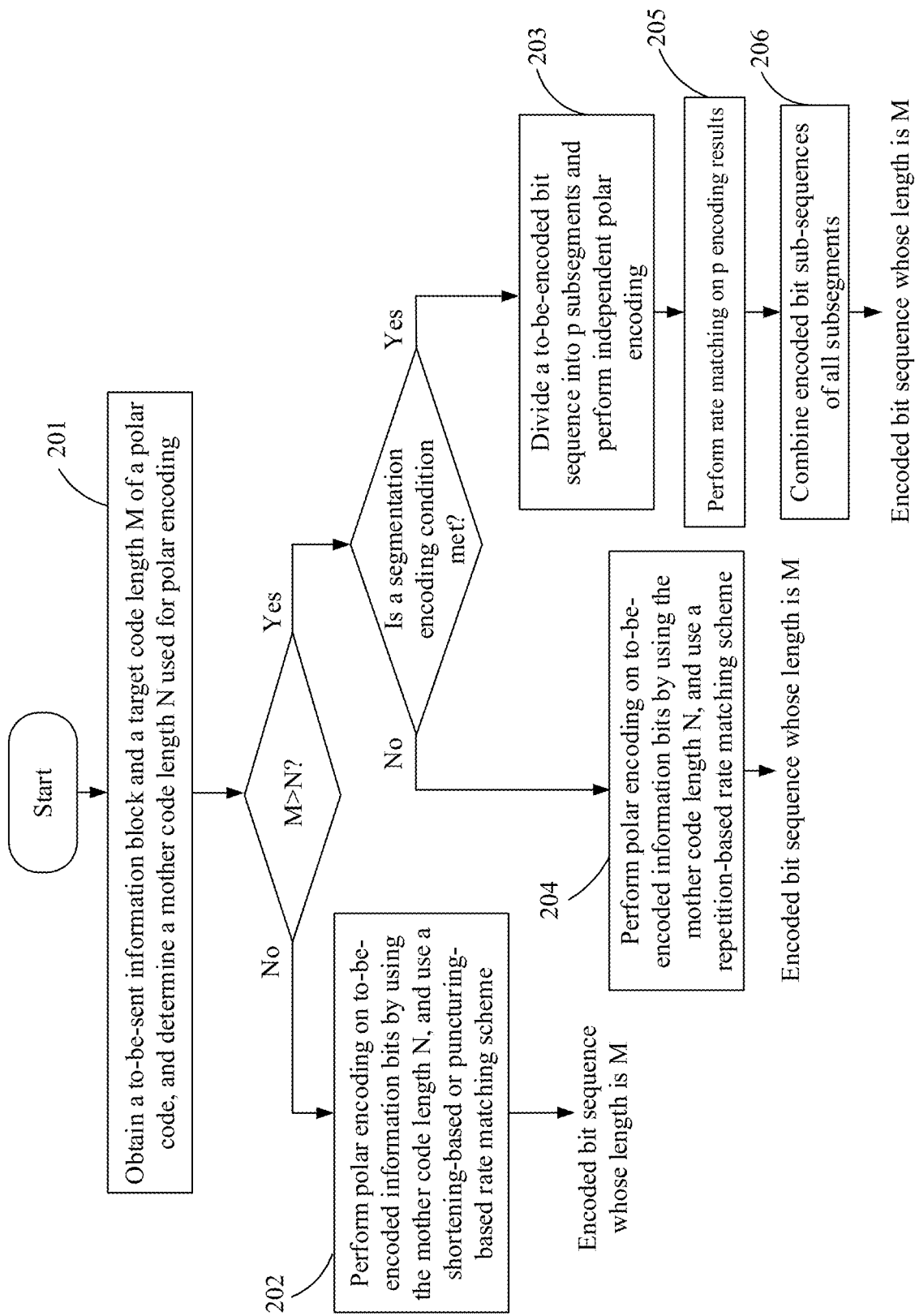
FIG. 2 is a flowchart of a coding method according to an embodiment of this application.

FIG. 2 is a flowchart of a coding method according to an embodiment of this application. The method includes the following steps.

201. Obtain a to-be-sent information block and a target code length M of a polar code, and determine a mother code length N.

A length of the information block is K, a code rate is R, M=INT(K/R), and INT indicates rounding.

203. When the target code length M is greater than the mother code length determined in step 201, if an encoding parameter of the information block meets a preset condition (also referred to as a segmentation encoding condition), segment a to-be-encoded information bit sequence into p subsegments, and perform independent encoding on the p subsegments, to obtain p encoded bit sequences, where p is an integer greater than or equal to 2, a total length of the to-be-encoded information bit sequence is Kc, information bit lengths of the p subsegments are respectively K1, K2, . . . , Kp, and Kc=K1+K2+ . . . +Kp.

Specifically, target code lengths after the independent polar encoding is performed on the p subsegments are respectively M1, M2, Mp, where M=M1+M2+ . . . +Mp. It is determined, based on M1, M2, Mp, that mother code lengths of the subsegments are respectively N1, N2, Np. Polar encoding is separately performed on the p subsegments by using the mother code lengths N1, N2, Np.

To be specific, for each Mi, where i=1, 2, . . . , p, when Mi>Ni, polar encoding is performed by using a mother code length Ni on a subsegment corresponding to Mi, to obtain an encoded bit sequence whose length is Ni, and subsequently, a repetition-based rate matching scheme is used. When Mi≤Ni, polar encoding is performed by using a mother code length Ni on a subsegment corresponding to Ki, to obtain an encoded bit sequence whose length is Ni, and subsequently, a shortening-based or puncturing-based rate matching scheme is used.

There are a plurality of manners of determining the mother code length N, and three manners are described below:

(1) If a maximum mother code length $N_{max}$ is specified in a communications system, a value of the mother code length may be determined according to $N=\min(2^{\lceil \log_2 M \rceil}, N_{max})$. To be specific, when $M>N_{max}$, $N=N_{max}$ is determined, encoding is performed by using the mother code length N, to obtain an encoded bit sequence whose length is N, and at least some bits are repeated, to obtain an encoded bit sequence whose length is M. When $M \leq N_{max}$, encoding is performed by using $N=2^{\lceil \log_2 M \rceil}$, to obtain an encoded bit sequence whose length is N, and a shortening-based or puncturing-based rate matching scheme is used, to obtain an encoded bit sequence whose length is M, where [•] indicates rounding up.

(2) A value that is less than the target code length and that meets that a mother code rate is less than or equal to a code rate threshold is preferentially selected for N, otherwise $N=2^{\lceil \log_2 M \rceil}$ is selected, where [•] indicates rounding up. The mother code rate is defined as R0=K/N, where $N=2^n$, n is an integer less than or equal to $\log_2 M$, and K is the length of the information block. For example, the code rate threshold may be set to 1/6 or 1/4. Assuming that the code rate threshold is 1/4, M=288, and K=40, a value of N meeting that K/N is less than 1/4 is 256. In this case, N=256. If K=80, no value less than or equal to 256 and that meets that 80/N is less than or equal to 1/4 can be selected for N, which is equal to an integer power of 2. In this case, $N=2^{\lceil \log_2 M \rceil}=512$ can be determined.

(3) A value that is less than the target code length and that meets $M \leq N \times (1+\delta)$ is preferentially selected for N, otherwise $N=2^{\lceil \log_2 M \rceil}$ is selected, where [•] indicates rounding up. δ may be a constant, for example, may be set to 1/8, 1/4, or 3/8. δ may be a value related to a mother code rate, and δ=FUNCTION(R0), where R0=K/N, and K is the length of the information block and usually decreases according to an increase in R0. A function of δ relative to the code rate R may be designed as: δ=β×(1−R0), where β is a preset constant, for example, β may be 1/2, 3/8, 1/4, 1/8, or 1/16. In other words, δ is a linear function of R0. A larger value of R0 indicates a smaller value of δ, namely, indicates a smaller allowed quantity of repeated bits. A function of δ relative to the code rate R may be designed as: δ=β×(1−R0)^2, where β is a constant, for example, β may be 1/2. In other words, δ is a quadratic function of R0. A larger value of R0 indicates a smaller value of δ, namely, indicates a smaller allowed quantity of repeated bits.

The three manners are applicable to selection of the mother code length for the to-be-encoded information bit sequence, and also applicable to selection of a mother code length for a subsegment obtained after segmentation.

205. Separately perform corresponding rate matching on the p subsegments, to obtain p encoded bit sequences whose lengths are respectively target code lengths of the subsegments. Specifically, if a target code length Mi of each subsegment is greater than a mother code length Ni, at least some bits of the encoded bit sequence whose length is Ni are repeated, to obtain an encoded bit sequence whose length is Mi. If a target code length Mi of each subsegment is less than or equal to a mother code length Ni, a puncturing-based or shortening-based rate matching scheme is used to delete an encoded bit at a puncturing position or a shortening position, to obtain an encoded bit sequence whose length is Mi.

206. Combine the p encoded bit sequences obtained in step 205, to obtain an encoded bit sequence whose length is M.

Optionally, after the p subsegments are obtained through division in step 203, a subsegment, whose encoding parameter meets the preset condition, in the p subsegments may be further segmented into p subsegments, and independent encoding and rate matching are performed on the p subsegments.

To be specific, for each Mi, where i=1, 2, . . . , p, if the target code length Mi is greater than the mother code length Ni, and an encoding parameter of a subsegment corresponding to Mi meets the preset condition, the subsegment corresponding to Mi is further segmented into p subsegments, independent encoding and rate matching are performed on the p subsegments, to obtain p corresponding encoded bit sequences, and the p encoded bit sequences are combined, to obtain an encoded bit sequence whose target code length is Mi. If the target code length Mi is greater than the mother code length Ni, but the encoding parameter of the subsegment corresponding to Mi does not meet the preset condition, polar encoding is performed by using the mother code length Ni on the subsegment corresponding to Mi, to obtain a third encoded bit sequence whose length is Ni, and at least some bits in the third encoded bit sequence are repeated, to obtain an encoded bit sequence whose length is Mi. If the target code length Mi is less than or equal to the mother code length Ni, polar encoding is performed by using the mother code length Ni on the subsegment corresponding to Ki, to obtain an encoded bit sequence, and the encoded bit sequence is shortened or punctured, to obtain an encoded bit sequence whose length is Mi.

Optionally, when the target code length M is greater than the mother code length determined in step 201, if the encoding parameter of the information block does not meet the preset condition (segmentation encoding condition), step 204 may be performed.

204. Perform polar encoding on the to-be-encoded information bit sequence by using the mother code length N, and use a repetition-based rate matching scheme. Specifically, an encoded bit sequence whose length is N is obtained after the polar encoding, and at least some bits of the encoded bit sequence whose length is N are repeated, to obtain an encoded bit sequence whose length is M.

Optionally, if the target code length M is less than or equal to the mother code length N, step 202 may be performed.

202. Perform polar encoding on the to-be-encoded information bit sequence by using the mother code length N, and use a shortening-based or puncturing-based rate matching scheme. Specifically, an encoded bit sequence whose length is N is obtained after the polar encoding, and the encoded bit sequence whose length is N is shortened or punctured, to obtain an encoded bit sequence whose length is M.

Figure 3:
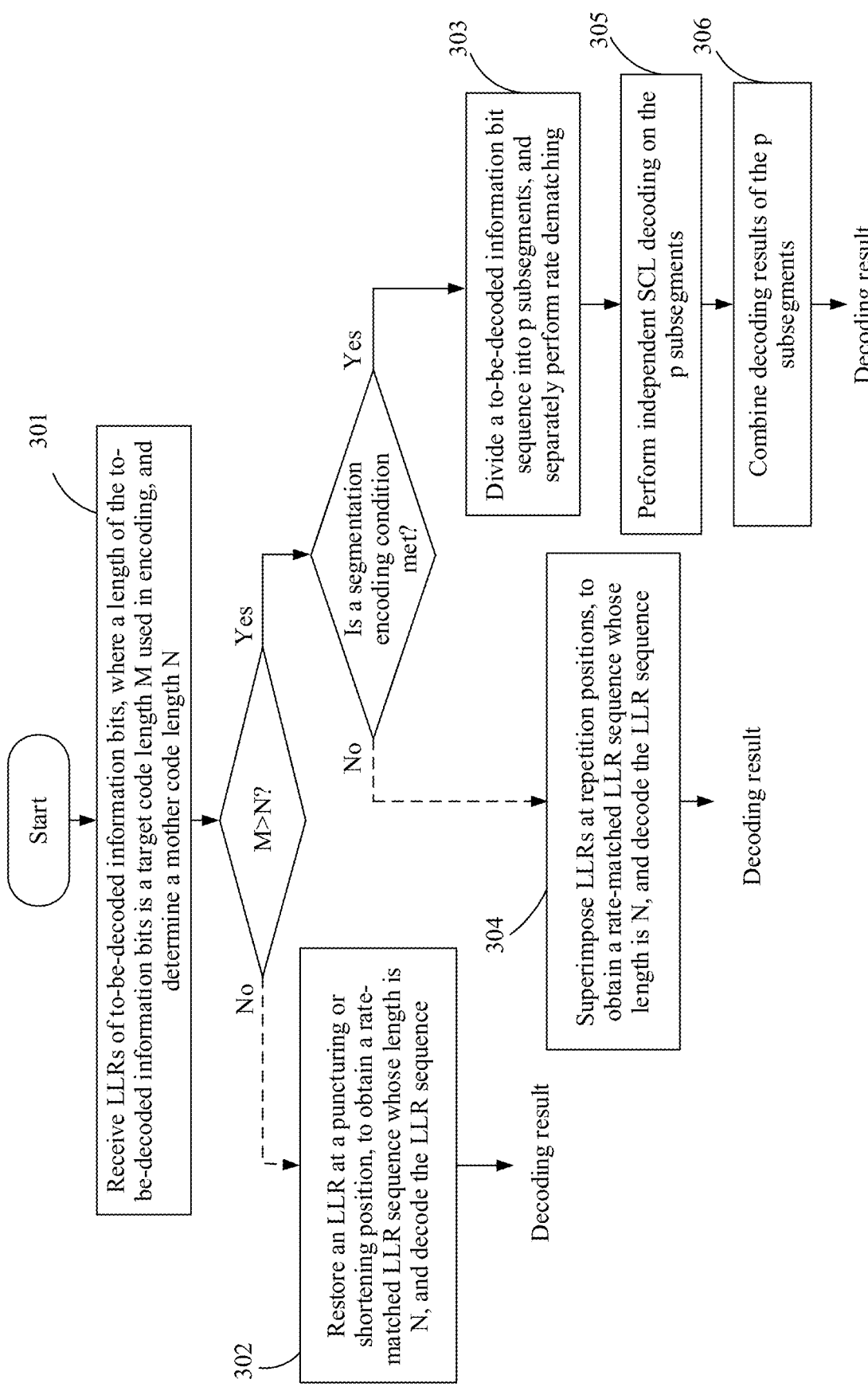
FIG. 3 is a flowchart of a decoding method according to an embodiment of this application.

FIG. 3 is a flowchart of a decoding method according to an embodiment of this application. The method includes the following steps.

301. Receive LLRs corresponding to to-be-decoded information bits, and determine a mother code length N, where a length of the to-be-decoded information bits is a target code length M used in polar encoding.

A receiving end may obtain, by using scheduling information of a system, an encoding parameter, for example, values such as K, M, R, and N, related to an encoder side. The receiving end may also determine the target code length M based on the received LLRs.

303. When the target code length M is greater than the mother code length N determined in step 301, if an encoding parameter meets a preset condition (also referred to as a segmentation encoding condition), segment an LLR sequence corresponding to the to-be-decoded information bits into p subsegments, and separately perform de-rate matching on the p subsegments. Specifically, the LLR sequence corresponding to the to-be-decoded information bits is segmented into the p subsegments, where p is an integer greater than or equal to 2. A total length of a to-be-decoded information bit sequence is M, and information bit lengths of the p subsegments are respectively M1, M2, Mp, where M=M1+M2+ . . . +Mp.

A mother code length N and a corresponding rate matching scheme are determined according to an agreed rule. A specific method is the same as that used at the encoder side, and for details, reference may be made to the three manners described in step 203 in the procedure.

Separately perform de-rate matching on the p subsegments obtained through division in step 303. Specifically, it is determined that mother code lengths of the subsegments are N1, N2, Np, respectively. For each Mi, where i=1, 2, . . . , p, when Mi>Ni, it is determined that a transmitting end performs rate matching based a repetition scheme, and LLRs at repetition positions are superimposed, to obtain a de-rate-matched LLR sequence whose length is Ni. When Mi≤Ni, it is determined that the transmitting end performs rate matching in a shortening or puncturing manner, and an LLR at a shortening or puncturing position (at which an agreed fixed value is set) is restored, to obtain a rate-matched LLR sequence whose length is Ni.

305. Perform independent SCL decoding on p subsegments, to obtain decoding results of the p subsegments. Specifically, SCL decoding is performed on rate-matched LLRs of the p subsegments, to obtain the p decoding results.

306. Combine the decoding results, obtained in step 305, of the p subsegments, to output a final decoded bit sequence.

Optionally, after the p subsegments are obtained through division in step 303, a subsegment, whose encoding parameter meets the preset condition, in the p subsegments may be further segmented into p subsegments, de-rate matching and decoding are separately performed on the p subsegments, to obtain decoding results of the p subsegments, and the decoding results are combined.

Optionally, when the target code length M is greater than the mother code length N, if an encoding parameter of an information block does not meet the preset condition (segmentation encoding condition), step 304 may be performed.

304. Superimposing LLRs at repetition positions, to obtain a rate-matched LLR sequence whose length is N, and decode the LLR sequence.

Optionally, if the target code length M is less than or equal to the mother code length N, step 302 may be performed.

302. Restore an LLR at a puncturing or shortening position, to obtain a rate-matched LLR sequence whose length is N, and decode the LLR sequence.

According to the coding method and the decoding method in the embodiments of this application, the p subsegments may be even subsegments. For example, the total length of the to-be-encoded bit sequence is Kc, a length of each subsegment is Kc/p, and a corresponding target code length of each subsegment is M/p. If Kc or M is not divisible by p, adjustment is slightly made. According to different types of polar encoding methods, the to-be-encoded information bit sequence may include only a to-be-sent information block, that is, Kc=K. Alternatively, the to-be-encoded information bit sequence may include an information block and a CRC bit. In this case, Kc=K+$L_{CRC}$, where $L_{CRC}$ is a CRC bit length.

The encoding parameter described in this application includes one or more of the following: a code rate R, the target code length M, the mother code length N, the length K of the information block, the CRC bit length $L_{CRC}$, and the like. The preset condition (segmentation encoding condition) in this application may include any one of the following:

(1) For a given code rate R, the length K of the information block is greater than a preset threshold.

(2) For a given code rate R, the target code length M is greater than a preset threshold.

(3) For a given code rate R, the length Kc of the to-be-encoded information bit sequence is greater than a preset threshold.

The information block mentioned in this application is information to be actually sent in a communications system. The "to-be-encoded information bit sequence" described in the embodiments of this application is a sequence composed of information carried by using information bits corresponding to a set of information bit indexes during polar encoding. "Length" in this specification may be referred to as "quantity".

The polar code described in the embodiments of this application includes but is not limited to an Arikan polar code, and may be alternatively a CA-polar code, a PC-polar code, or a PC-CA-polar code. The Arikan polar code is an original polar code, is not concatenated with another code, and includes only information bits and frozen bits. The CA-polar code is a polar code concatenated with a cyclic redundancy check (CRC) code. The PC-polar code is a polar code concatenated with a parity check (PC) code. The PC-CA-polar code is a polar code concatenated with both a CRC code and a PC code. The PC-polar code, the CA-polar code, and the PC-CA-polar code improve performance of the polar code by concatenating the Arikan polar code with different codes.

"If M is greater than the mother code length N" described in this application may be equivalently expressed as "if $2^{\lceil \log_2 M \rceil}$ is greater than the mother code length N". Because the mother code length is an integer power of 2, from a perspective of an effect, "M is greater than the mother code length N" can be definitely inferred from "$2^{\lceil \log_2 M \rceil}$ is greater than the mother code length N"; conversely, "$2^{\lceil \log_2 M \rceil}$ is greater than the mother code length N" can also be definitely inferred from "M is greater than the mother code length N", where $\lceil \cdot \rceil$ indicates rounding up.

With reference to different types of polar code encoding manners, the following describes encoding and decoding methods in different embodiments. In a same embodiment, a coding method and a decoding method are combined for description, but a coding method at a transmitting end and a decoding method at a receiving end are procedures that correspond to each other and are independent of each other. For ease of description, in all embodiments described below, p=2, that is, two even segments are obtained through segmentation.

The manner (1) described in step 201 of the coding method is used as an example of a manner of determining a mother code length. It is assumed that a maximum mother code length $N_{max}$ is specified in a communications system. A value of the mother code length used in each encoding is determined according to N=min($2^{\lceil \log_2 M \rceil}$, $N_{max}$). To be specific, when M>$N_{max}$, N=$N_{max}$, and a repetition-based rate matching scheme is usually used. However, in this application, whether to perform segmentation encoding is further determined, to reduce a loss caused by repetition. Therefore, if a value of N is determined according to N=min($2^{\lceil \log_2 M \rceil}$, $N_{max}$), in the coding method and the decoding method in this application, "when M is greater than N" may be simplified as "when M>$N_{max}$ or $2^{\lceil \log_2 M \rceil}$>$N_{max}$". If it is determined that an encoding parameter meets a preset condition, a segmentation coding method is used. If the encoding parameter does not meet the preset condition, polar encoding is performed once by still using N=$N_{max}$, and the repetition-based rate matching scheme is used. When M≤N, N=$2^{\lceil \log_2 M \rceil}$≤$N_{max}$. Therefore, "when M≤N" may be simplified as "when M≤$N_{max}$ or $2^{\lceil \log_2 M \rceil}$≤$N_{max}$". In this case, polar encoding is performed by using N=$2^{\lceil \log_2 M \rceil}$, and a shortening-based or puncturing-based rate matching method is used to obtain a target code length. Therefore, when "M is greater than N" is replaced with "$2^{\lceil \log_2 M \rceil}$ is greater than $N_{max}$", and "M is less than or equal to N" is replaced with "$2^{\lceil \log_2 M \rceil}$ is less than or equal to $N_{max}$"; or certainly when "M is greater than N" may be replaced with "M is greater than $N_{max}$", and "M is less than or equal to N" may be replaced with "M is less than or equal to $N_{max}$", the objectives of this application can still be achieved in the following embodiments.

Figure 4:
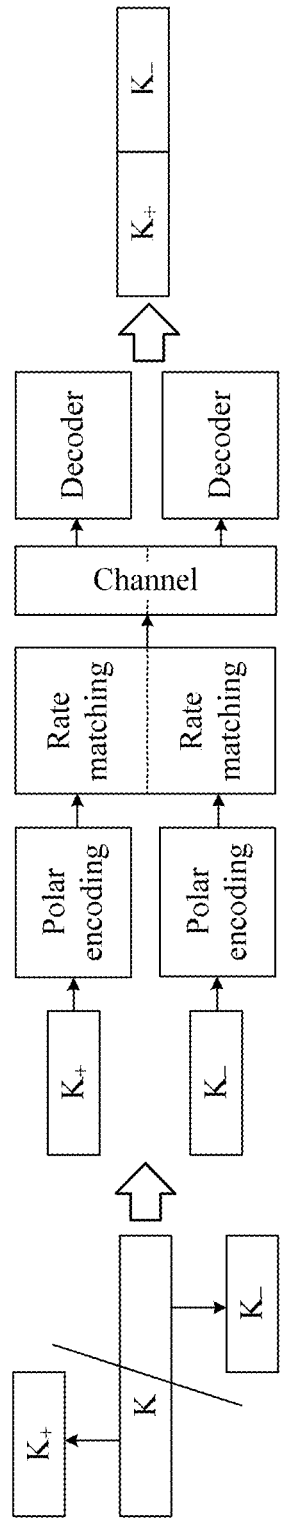
FIG. 4 is a schematic diagram of Arikan polar encoding method and decoding method.

For Arikan polar code, information bits carry only an information block, and therefore a length of the information block is a quantity of information bits. Polar code segmentation encoding is performed on a to-be-encoded bit sequence whose target code length M is greater than a maximum mother code length $N_{max}$ and that meets a polar code segmentation encoding condition, and a receiving end performs decoding and combines decoding results. FIG. 4 is a schematic flowchart of an Arikan polar encoding method and decoding method. The encoding and decoding process includes the following:

(1) Determine a target code length M by using an allocated physical resource or a quantity K of information bits and a code rate R, for example, M=INT(K/R), where INT indicates rounding.

(2) Determine a mother code length N=min($2^n$, $N_{max}$) based on the target code length M, where n is a minimum integer greater than or equal to $\log_2 M$. In other words, N=min($2^{\lceil \log_2 M \rceil}$, $N_{max}$), where $\lceil \cdot \rceil$ indicates rounding up, min($\cdot$) indicates a minimum value that is returned, and $N_{max}$ indicates a maximum system-supported mother code length.

(3) If $2^{\lceil \log_2 M \rceil}$ is greater than the maximum mother code length $N_{max}$, and the polar code segmentation encoding condition is met, segment information into a subsegment 0 and a subsegment 1, and separately perform polar code encoding, that is, separately perform polar code segmentation encoding on the subsegment 0 and the subsegment 1 by using ($K_+$, $M_+$) and ($K_-$, $M_-$), where K=$K_+$+$K_-$, and M=$M_+$+$M_-$. $K_+$ is a quantity of information bits of the subsegment 0, $K_-$ is a quantity of information bits of the subsegment 1, $M_+$ is a target code length of the subsegment 0, and $M_-$ is a target code length of the subsegment 1. If a mother code length of the subsegment 0 or the subsegment 1 is still greater than the maximum mother code length, and the polar code segmentation encoding condition is met, segmentation is continued. When the segmentation encoding condition is not met, a repetition-based rate matching scheme is used.

$K_+$ herein corresponds to K1 mentioned above, $K_-$ corresponds to K2 mentioned above, $M_+$ corresponds to M1 mentioned above, and $M_-$ corresponds to M2 mentioned above. For ease of description in the following, $K_+$ and $K_-$ represent K1 and K2, respectively, and $M_+$ and $M_-$ represent M1 and M2, respectively.

The polar code segmentation encoding condition is determined by the code rate R and the length K of the information block, the target code length M, or a length Kc of a to-be-encoded information bit sequence. For a given code rate R, the length K of the information block is greater than a preset threshold, the target code length M is greater than a preset threshold, or the length Kc of the to-be-encoded information bit sequence is greater than a preset threshold. Conditions of different parameters correspond to different thresholds, and settings of thresholds for different $N_{max}$ values may also be different.

(4) Perform rate matching. If segmentation encoding is performed in step (3), combine encoded bit sequences that are obtained by encoding all subsegments, to obtain a final encoded bit sequence.

(5) The receiving end performs corresponding de-rate dematching, finally decodes information of the subsegments according to an encoding rule, and completes information combination.

Figure 5:
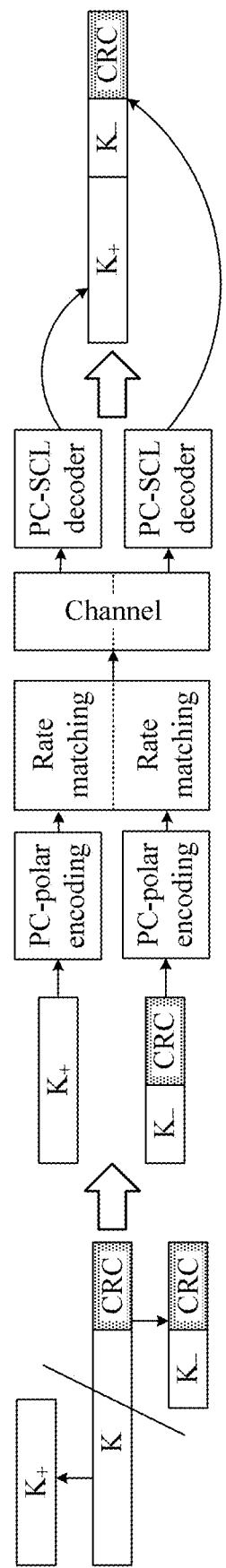
FIG. 5 is a schematic diagram of an embodiment of PC-polar encoding method and decoding method.

Polar code segmentation encoding is applicable to a PC-polar encoding and decoding process. A schematic flowchart is shown in FIG. 5, including the following:

(1) Determine a target code length M by using an allocated physical resource or a quantity K of information bits and a code rate R, for example, M=INT(K/R), where INT indicates rounding. For example, if K=30, and R=1/6, M=180.

(2) Determine a mother code length $N=min(2^n, N_{max})$ based on the target code length M, where n is a minimum integer greater than or equal to $\log_2 M$. In other words, $N=min(2^{\lceil \log_2 M \rceil}, N_{max})$, where $\lceil \cdot \rceil$ indicates rounding up, min(•) indicates a minimum value that is returned, and $N_{max}$ indicates a maximum system-supported mother code length. For example, if M=180, and $N_{max}$=1024, n=8, N=min(256, 1024)=256. For another example, if M=1800, and $N_{max}$=1024, n=11, and N=min(2048, 1024)=1024.

(3) If $2^n$ is greater than the maximum mother code length, and a PC-polar code segmentation encoding condition is met, perform polar code segmentation encoding on a to-be-encoded bit sequence, namely, separately perform PC-polar code encoding on a subsegment 0 and a subsegment 1 by using ($K_+$, $M_+$) and ($K_-$, $M_-$), where $K+L_{CRC}=K_++K_-$, $M=M_++M_-$, $L_{CRC}$ is a CRC bit length, $K_+=\lceil(K+L_{CRC})/2\rceil$, $K_-=K+L_{CRC}-K_+$, $M_+\lceil M/2 \rceil$, and $M_-=M-M_+$. If a mother code length of a subsegment is still greater than the maximum mother code length, and the PC-polar code segmentation encoding condition is met, segmentation is continued. If $2^n$ is greater than the maximum mother code length $N_{max}$, and the PC-polar code segmentation encoding condition is not met, encoding is performed by using $N=N_{max}$, and a repetition-based rate matching manner is used. If $2^n$ is less than or equal to the maximum mother code length $N_{max}$, encoding is performed by using $N=2^n$, and a shortening-based or puncturing-based rate matching manner is used.

Herein, a PC-polar code concatenated with a CRC bit, also referred to as PC-CA-polar code, is used as an example, and the CRC bit may be used for assisting in PC-SCL decoding (error correction). For a pure PC-polar code, the CRC bit is not used for assisting in PC-SCL decoding, but may be used for error correction after the decoding.

The PC-polar code segmentation encoding condition is determined by the code rate R and a length Kc of a to-be-encoded information bit sequence, a length K of an information block, or the target code length M, where Kc corresponds to a quantity of information bits used in polar code construction. PC-polar code segmentation encoding conditions at different code rates are shown in Table 1. Table 1 lists values of different code rates and segmentation encoding conditions corresponding to the code rates. However, not all code rates and segmentation encoding conditions corresponding to the code rates can be listed. A suitable segmentation encoding condition at another code rate may be formulated.

TABLE 1

| R | 1/12 | 1/6 | 1/4 | 1/3 | 2/5 |
| --- | --- | --- | --- | --- | --- |
| Kc | ≥Kc1 | ≥Kc2 | ≥Kc3 | ≥Kc4 | ≥Kc5 |
| K | ≥Kt1 | ≥Kt2 | ≥Kt3 | ≥Kt4 | ≥Kt5 |
| M | ≥Mt1 | ≥Mt2 | ≥Mt3 | ≥Mt4 | ≥Mt5 |

If $N_{max}$=1024, a value of Kc1 may be an integer ranging in an interval [330, 370]; a value of Kc2 may be an integer ranging in an interval [345, 365]; a value of Kc3 may be an integer ranging in an interval [370, 380]; a value of Kc4 may be an integer ranging in an interval [450, 460]; and a value of Kc5 may be an integer ranging in an interval [500, 510].

If $N_{max}$=1024, a value of Kt1 may be an integer ranging in an interval [314, 354]; a value of Kt2 may be an integer ranging in an interval [329, 349]; a value of Kt3 may be an integer ranging in an interval [354, 364]; a value of Kt4 may be an integer ranging in an interval [434, 444]; and a value of Kt5 may be an integer ranging in an interval [484, 494].

If $N_{max}$=1024, a value of Mt1 may be an integer ranging in an interval [3768, 4248]; a value of Mt2 may be an integer ranging in an interval [1974, 2094]; a value of Mt3 may be an integer ranging in an interval [1416, 1456]; a value of Mt4 may be an integer ranging in an interval [1302, 1332]; and a value of Mt5 may be an integer ranging in an interval [1210, 1235].

If $N_{max}$=1024, in an example, Kc1=360, Kc2=360, Kc3=380, Kc4=460, Kc5=510, Kt1=344, Kt2=344, Kt3=364, Kt4=444, Kt5=494, Mt1=4128, Mt2=2064, Mt3=1456, Mt4=1332, or Mt5=1235. Segmentation encoding conditions are shown in Table 2.

TABLE 2

| | $N_{max}$ = 1024 | | | | |
| --- | --- | --- | --- | --- | --- |
| R | 1/12 | 1/6 | 1/4 | 1/3 | 2/5 |
| Kc | ≥360 | ≥360 | ≥380 | ≥460 | ≥510 |
| K | ≥344 | ≥344 | ≥364 | ≥444 | ≥494 |
| M | ≥4128 | ≥2064 | ≥1456 | ≥1332 | ≥1235 |

If $N_{max}$=512, a value of Kc1 may be an integer ranging in an interval [200, 220]; a value of Kc2 may be an integer ranging in an interval [205, 225]; a value of Kc3 may be an integer ranging in an interval [210, 220]; a value of Kc4 may be an integer ranging in an interval [120, 240]; and a value of Kc5 may be an integer ranging in an interval [265, 275].

If $N_{max}$=512, a value of Kt1 may be an integer ranging in an interval [184, 204]; a value of Kt2 may be an integer ranging in an interval [189, 209]; a value of Kt3 may be an integer ranging in an interval [194, 214]; a value of Kt4 may be an integer ranging in an interval [214, 224]; and a value of Kt5 may be an integer ranging in an interval [249, 259].

If $N_{max}$=512, a value of Mt1 may be an integer ranging in an interval [2208, 2448]; a value of Mt2 may be an integer ranging in an interval [1134, 1254]; a value of Mt3 may be an integer ranging in an interval [776, 856]; a value of Mt4 may be an integer ranging in an interval [642, 672]; and a value of Mt5 may be an integer ranging in an interval [623, 648]. In an example, if $N_{max}$=512, Kc1=210, Kc2=220, Kc3=220, Kc4=235, Kc5=270, Kt1=194, Kt2=204, Kt3=204, Kt4=219, Kt5=254, Mt1=2328, Mt2=1224, Mt3=816, Mt4=657, or Mt5=635. Segmentation encoding conditions are shown in Table 3.

TABLE 3

| R | 1/12 | 1/6 | 1/4 | 1/3 | 2/5 |
|---|---|---|---|---|---|
| Kc | ≥210 | ≥220 | ≥220 | ≥235 | ≥270 |
| K | ≥194 | ≥204 | ≥204 | ≥219 | ≥254 |
| M | ≥2328 | ≥1224 | ≥816 | ≥657 | ≥635 |

For a preset condition in this application, namely, a segmentation encoding condition, each R value in Tables 1 to 3 and a threshold of Kc corresponding to the R value constitute a segmentation encoding condition, each R value and a threshold of K corresponding to the R value constitute a segmentation encoding condition, and each R value and a threshold of M corresponding to the R value constitute a segmentation encoding condition. Therefore, in Tables 1 to 3, the segmentation encoding conditions are displayed together only for ease of presentation. However, this does not mean that the entire tables each are used as one segmentation encoding condition. In other words, this does not mean that the conditions listed in the tables need to be met at the same time.

It is assumed that $N_{max}$=1024, and the segmentation encoding condition is that Kc is greater than a preset threshold. For example, if K=401, $L_{CRC}$=16, N=1024, R=1/6, and M=2406, Kc=K+$L_{CRC}$=417. According to Table 2, the segmentation encoding condition is Kc≥360, and the segmentation encoding condition is met. In this case, $K_+$=⌈(406+16)/2⌉=209, $K_-$=417−209=208, $M_+$=2406/2=1203, and $M_-$=2406−1203=1203. Polar encoding is performed by using an encoding parameter (Kc, M), and therefore polar encoding is performed on two subsegments by using (209, 1203) and (208, 1203). For the two subsegments, mother code lengths of the two subsegments obtained in step (2) are N=$N_{max}$=1024, and M>N (2^⌈$\log_2$ M⌉>$N_{max}$). In this case, the segmentation encoding condition is not met. Therefore, segmentation is not continued, and a repetition-based rate matching scheme is used: 179 (1203−1024) bits in 1024 encoded bits are repeated, to obtain 1203 encoded bits.

It is assumed that $N_{max}$=1024, and the segmentation encoding condition is that Kc is greater than a preset threshold. For example, if K=800, $L_{CRC}$=16, N=1024, M=2400, R=1/3, Kc=K+$L_{CRC}$=816, and the segmentation condition Kc≥460 is met, $K_+$=(800+16)/2=408, $K_-$=816−408=408, $M_+$=2400/2=1200, and $M_-$=2400−1200=1200. Polar encoding is performed on two subsegments by using (408, 1200) and (408, 1200). Mother code lengths obtained in step (2) are N=1024. In this case, a repetition condition and the segmentation encoding condition are met, and segmentation is continued. One segment (408, 1200) of the two subsegments is used as an example, $K_+$=204, $M_+$=600, $K_-$=204, $M_-$=600, and polar encoding is performed by using (204, 600). Mother code lengths obtained in step (2) are N=1024>M. Therefore, a puncturing-based or shortening-based rate matching scheme is used: 1024 encoded bits are punctured or shortened to 600 encoded bits.

(4) Perform rate matching; and if segmentation encoding exists, combine encoded bit sequences of the subsegments, to obtain an encoded bit sequence whose length is M.

(5) After channel transmission, a receiving end processes a received LLR sequence (an LLR sequence corresponding to to-be-decoded bits) based on scheduling information according to an agreed rule.

a. After knowing an encoding parameter (K, M, R, N), the receiving end determines whether the segmentation encoding condition is met according to step (3), and if the segmentation encoding condition is met, segments the received LLR sequence into two segments and separately performs processing in subsequent steps.

(i) Assuming that $N_{max}$=1024, K=400, M=2400, R=1/6, N=1024, 2^⌈$\log_2$ M⌉=4096>1024, Kc=400+16=416>360, and the repetition condition and the segmentation condition are met, the received LLR sequence whose length is 2400 is segmented into two segments for processing.

(ii) Assuming that $N_{max}$=1024, K=200, M=2400, R=1/12, N=1024, 2^⌈$\log_2$ M⌉=4096>1024, Kc=216<360, and the segmentation encoding condition is not met, segmentation decoding is not performed on the received LLR sequence whose length is 2400.

(iii) Assuming that $N_{max}$=1024, K=200, M=800, R=1/4, N=1024, 2^⌈$\log_2$ M⌉=1024=$N_{max}$, and the segmentation condition is not met, segmentation decoding is not performed on the received LLR sequence whose length is 800.

b. According to the rate matching scheme, zeros or infinities are added to LLRs, or superposition is performed for the LLRs (corresponding to the puncturing-based, shortening-based, or repetition-based rate matching scheme), to obtain a de-rate-matched LLR sequence.

(i) The repetition-based rate matching scheme is used, and LLRs at 176 (1200−1024) repetition positions are superimposed according to a repetition mode. Finally, a length of an LLR sequence of each segment is 1024, and there are two segments.

(ii) The repetition-based rate matching scheme is used, and LLRs at 1376 (2400−1024) repetition positions are superimposed according to a repetition mode, to obtain an LLR sequence whose length is 1024.

(iii) The shortening-based rate matching scheme is used, and infinities are added to the LLRs. An LLR sequence whose length is 800 is restored according to a shortening mode, and infinite values are set at 224 (1024−800) shortening positions, to obtain an LLR sequence whose length is 1024.

(6) If segmentation encoding is performed at an encoder side, the receiving end performs independent PC-SCL decoding on the LLRs the subsegments obtained in step (5), to output a decoding result of each subsegment, and finally combines decoding results of the two subsegments. In this case, the CRC bit is not used for assisting in PC-SCL decoding.

Figure 6:
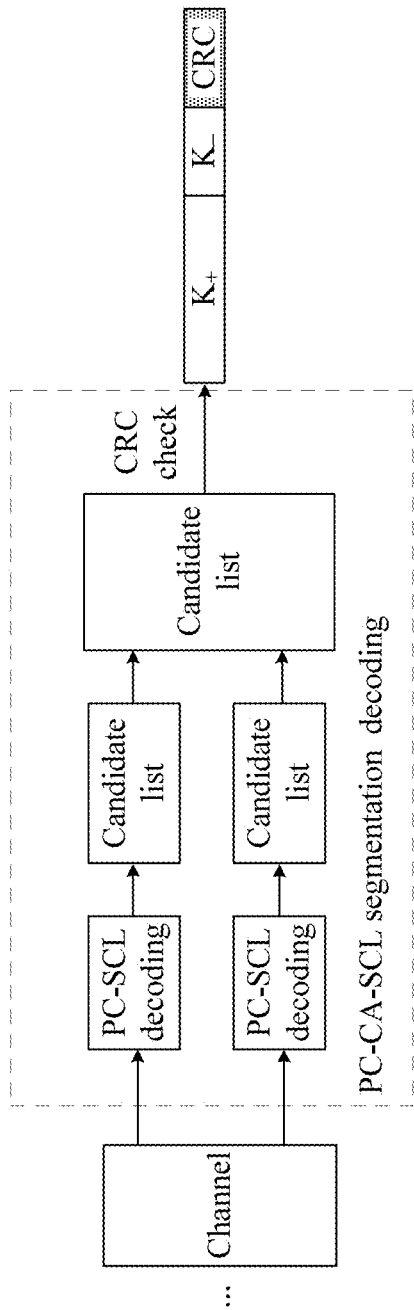
FIG. 6 is a schematic diagram of an embodiment of PC-CA-SCL decoding method.

In an optional manner, for PC-SCL decoding of each subsegment, refer to FIG. 6. In this case, a CRC bit is used for assisting in decoding. A PC-SCL decoder may output $L_p$ pieces of candidate information and $L_p$ PM values, combine a total of $2L_p$ candidate paths of the subsegment 0 and subsegment 1 in pairs, to obtain $L_p \times L_p$ candidate paths, and add up PM values of candidate paths that are of the two subsegments and that are in each path obtained through combination. The $L_p \times L_p$ candidate paths are sorted in ascending or descending order of a PM value, optimal $T_p$ candidate paths are selected for CRC check, and the first path whose check succeeds is selected as a decoding output; or CRC check is performed on all $T_p$ candidate paths, and a path, in candidate paths whose check succeeds, with an optimal PM value is selected, where $T_p \leq L_p \times L_p$, $L_p$ is equal to a quantity of candidate lists of PC-SCL, and $T_p$ is a quantity of candidate paths participating in CRC check selection.

For example, one PC-SCL decoder outputs eight pieces of candidate information and eight PM values. A total of 16 pieces of candidate information output by two decoders are combined in pairs, to obtain 64 pieces of candidate information, and corresponding PM values are added up. The 64 pieces of candidate information are sorted in ascending order of a PM value, and eight pieces of optimal candidate information are selected for CRC check. In this case, $\log_2(8)=3$ bits need to be added to an original CRC bit to ensure a false alarm rate (FAR). The check starts from an optimal candidate path, and the first path whose check succeeds is selected as a decoding output.

Figure 7:
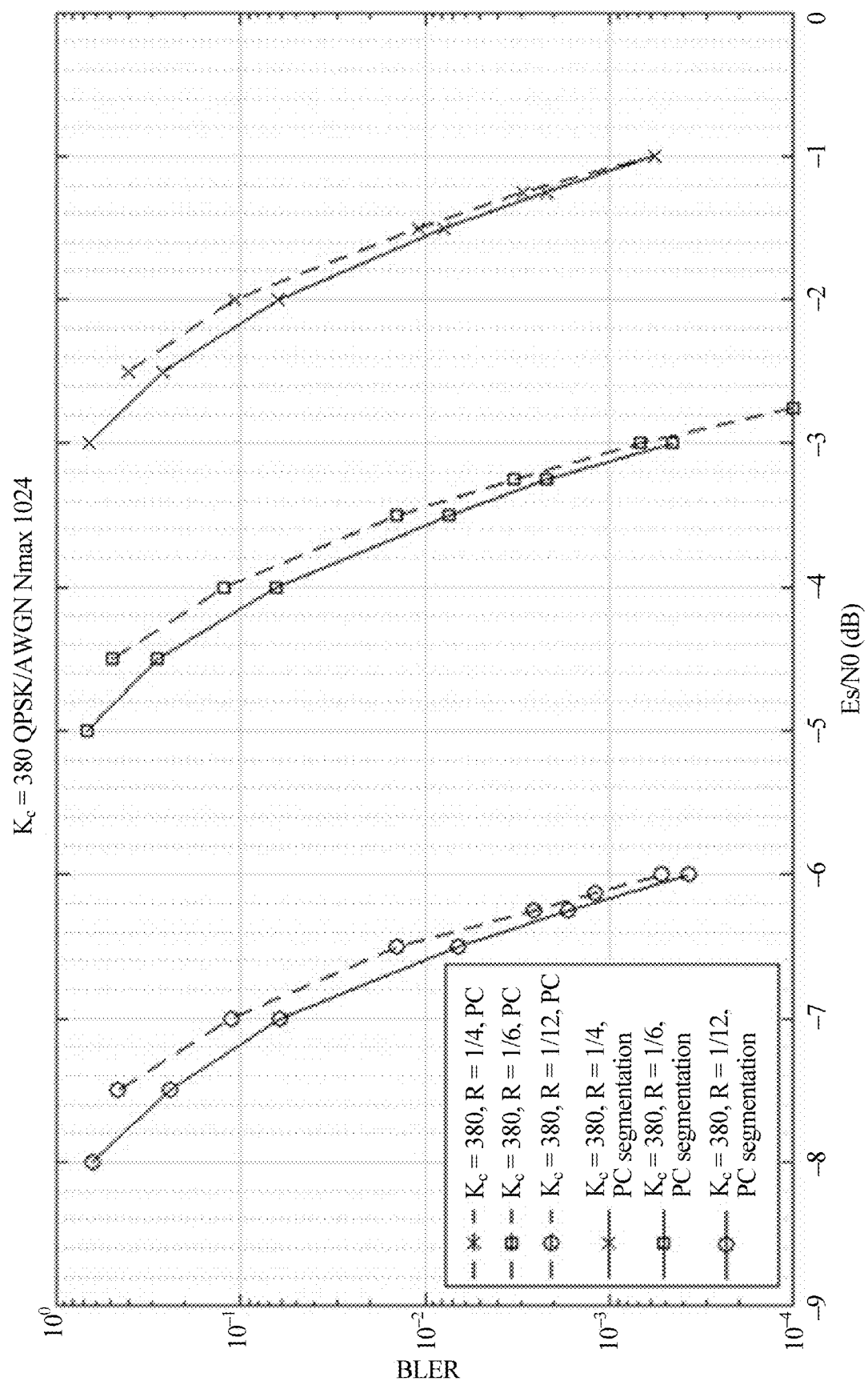
FIG. 7 is a diagram of decoding performance comparison between common PC-polar encoding and PC-polar segmentation encoding.

FIG. 7 is a simulation result diagram of setting a segmentation encoding condition by using Kc when $N_{max}=1024$, and shows comparison between decoding performance of common PC-polar encoding and decoding performance of PC-polar segmentation encoding at different code rates. In FIG. 7, Kc=380, a solid line shows decoding performance of the segmentation encoding, and a dashed line shows decoding performance of the common PC-polar encoding. It can be learned that, at a same code rate, decoding performance of the segmentation encoding is higher than decoding performance of the common PC-polar encoding.

Figure 8:
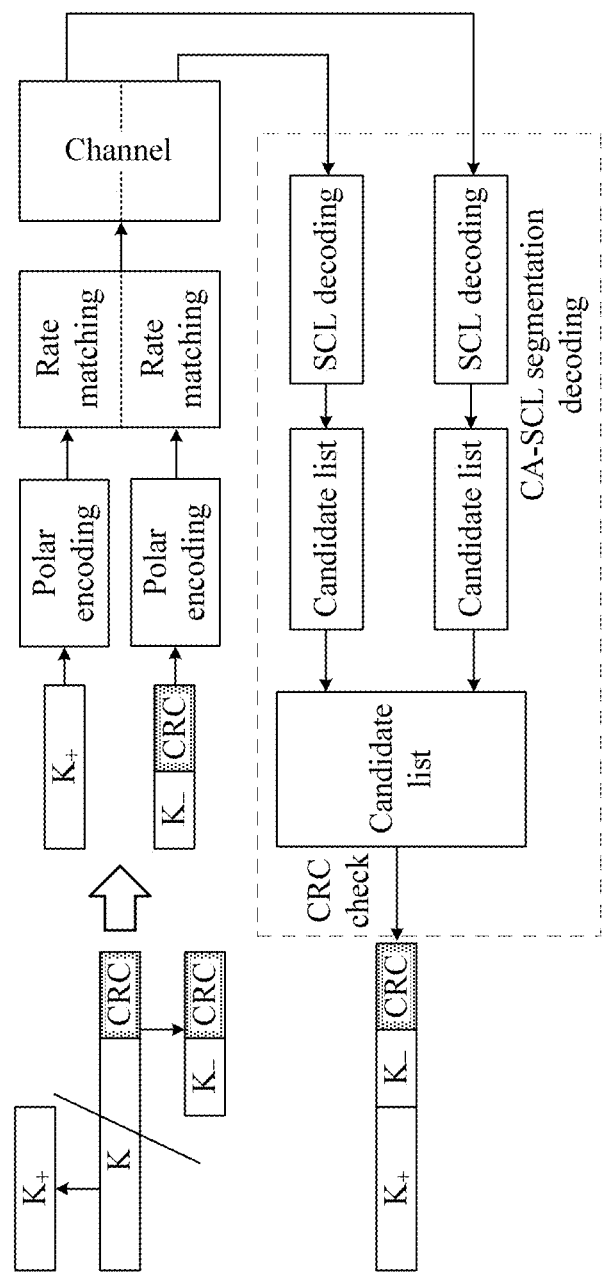
FIG. 8 is a schematic diagram of an embodiment of CA-polar encoding method and decoding method.

Polar code segmentation encoding is applicable to a CA-polar encoding and decoding process, as shown in FIG. 8, and the process may include the following:

(1) Determine a target code length M by using an allocated physical resource or a quantity K of information bits and a code rate R, for example, M=INT(K/R), where INT indicates rounding.

(2) Determine a mother code length $N=\min(2^n, N_{max})$ based on the target code length M, where n is a minimum integer greater than or equal to $\log_2 M$. In other words, $N=\min(2^{\lceil \log_2 M \rceil}, N_{max})$, where $\lceil \cdot \rceil$ indicates rounding up, $\min(\cdot)$ indicates a minimum value that is returned, and $N_{max}$ indicates a maximum system-supported mother code length.

(3) If $2^n$ is greater than the maximum mother code length, and a CA-polar code segmentation encoding condition is met, perform polar code segmentation encoding on a to-be-encoded bit sequence, namely, separately perform CA-polar code encoding on a subsegment 0 and a subsegment 1 by using $(K_+, M_+)$ and $(K_-, M_-)$, where $K+L_{CRC}=K_++K_-$, $M=M_+ \ldots +M_-$, $L_{CRC}$ is a CRC bit length, $K_+=\lceil(K+L_{CRC})/2\rceil$, $K_-=K+L_{CRC}-K_+$, $M_+=\lceil M/2 \rceil$, and $M_-=M-M_+$.

In an example, the CRC bit length may be 19. If a mother code length of a subsegment is still greater than the maximum mother code length, and the CA-polar code segmentation encoding condition is met, segmentation is continued; otherwise, another rate matching method is used.

If $2^n$ is greater than the maximum mother code length $N_{max}$, and the CA-polar code segmentation encoding condition is not met, encoding is performed by using $N=N_{max}$, and a repetition-based rate matching scheme is used. If $2^n$ is less than or equal to the maximum mother code length $N_{max}$, encoding is performed by using $N=2^n$, and a shortening-based or puncturing-based rate matching scheme is used.

(4) Perform rate matching; and if segmentation encoding exists, combine encoded bit sequences of the subsegments, to obtain an encoded bit sequence whose length is M.

(5) A receiving end performs de-rate matching, and performs independent SCL decoding on the subsegments, to output $L_p$ candidate paths of subsegments and $L_p$ PM values, where $L_p$ is a size of a candidate list, combines $2L_p$ subsegment candidate paths in pairs, to obtain $L_P \times L_P$ candidate paths, and selects $T_p$ optimal candidate paths based on the PM values. A CA-polar code is concatenated with a CRC bit to assist in SCL decoding. Therefore, CRC check may start from a path, in $T_P$ candidate paths, with an optimal PM value, and the first path whose CRC check succeeds is selected as a decoding output, where $T_p \leq L_p \times L_p$.

The CA-polar code segmentation encoding condition is determined by the code rate R and a length Kc of a to-be-encoded information bit sequence, a length K of an information block, or the target code length M, where Kc corresponds to a quantity of information bits used in polar code construction.

If $N_{max}=1024$, a value of Kc1 may be an integer ranging in an interval [310, 340]; a value of Kc2 may be an integer ranging in an interval [350, 365]; a value of Kc3 may be an integer ranging in an interval [410, 450]; a value of Kc4 may be an integer ranging in an interval [470, 495]; and a value of Kc5 may be an integer ranging in an interval [520, 530].

If $N_{max}=1024$, a value of Kt1 may be an integer ranging in an interval [291, 321]; a value of Kt2 may be an integer ranging in an interval [331, 346]; a value of Kt3 may be an integer ranging in an interval [391, 431]; a value of Kt4 may be an integer ranging in an interval [451, 476]; and a value of Kt5 may be an integer ranging in an interval [501, 511].

If $N_{max}=1024$, a value of Mt1 may be an integer ranging in an interval [3492, 3852]; a value of Mt2 may be an integer ranging in an interval [1986, 2076]; a value of Mt3 may be an integer ranging in an interval [1564, 1724]; a value of Mt4 may be an integer ranging in an interval [1353, 1428]; and a value of Mt5 may be an integer ranging in an interval [1253, 1278].

If $N_{max}=1024$, in an example, Kc1=320, Kc2=360, Kc3=430, Kc4=490, Kc5=530, Kt1=301, Kt2=341, Kt3=411, Kt4=471, Kt5=511, Mt1=3612, Mt2=2046, Mt3=1644, Mt4=1413, or Mt5=1278. CA-polar segmentation encoding conditions are shown in Table 4.

TABLE 4

| R  | 1/12   | 1/6    | 1/4    | 1/3    | 2/5    |
|----|--------|--------|--------|--------|--------|
| Kc | ≥320   | ≥360   | ≥430   | ≥490   | ≥530   |
| K  | ≥301   | ≥341   | ≥411   | ≥471   | ≥511   |
| M  | ≥3612  | ≥2046  | ≥1644  | ≥1413  | ≥1278  |

If $N_{max}=512$, a value of Kc1 may be an integer ranging in an interval [170, 190]; a value of Kc2 may be an integer ranging in an interval [185, 195]; a value of Kc3 may be an integer ranging in an interval [210, 230]; a value of Kc4 may be an integer ranging in an interval [250, 260]; and a value of Kc5 may be an integer ranging in an interval [270, 280].

If $N_{max}=512$, a value of Kt1 may be an integer ranging in an interval [151, 171]; a value of Kt2 may be an integer ranging in an interval [166, 176]; a value of Kt3 may be an integer ranging in an interval [191, 211]; a value of Kt4 may be an integer ranging in an interval [231, 241]; and a value of Kt5 may be an integer ranging in an interval [251, 261].

If $N_{max}=512$, a value of Mt1 may be an integer ranging in an interval [1812, 2052]; a value of Mt2 may be an integer ranging in an interval [996, 1056]; a value of Mt3 may be an integer ranging in an interval [764, 844]; a value of Mt4 may be an integer ranging in an interval [693, 723]; and a value of Mt5 may be an integer ranging in an interval [628, 653].

In an example, if $N_{max}=512$, Kc1=180, Kc2=190, Kc3=220, Kc4=255, Kc5=275, Kt1=161, Kt2=171, Kt3=201, Kt4=236, Kt5=256, Mt1=1932, Mt2=1026, Mt3=804, Mt4=708, or Mt5=640. Segmentation encoding conditions are shown in Table 5.

TABLE 5

| R  | 1/12  | 1/6   | 1/4  | 1/3  | 2/5  |
|----|-------|-------|------|------|------|
| Kc | ≥180  | ≥190  | ≥220 | ≥255 | ≥275 |
| K  | ≥161  | ≥171  | ≥201 | ≥236 | ≥256 |
| M  | ≥1932 | ≥1026 | ≥804 | ≥708 | ≥640 |

Figure 9:
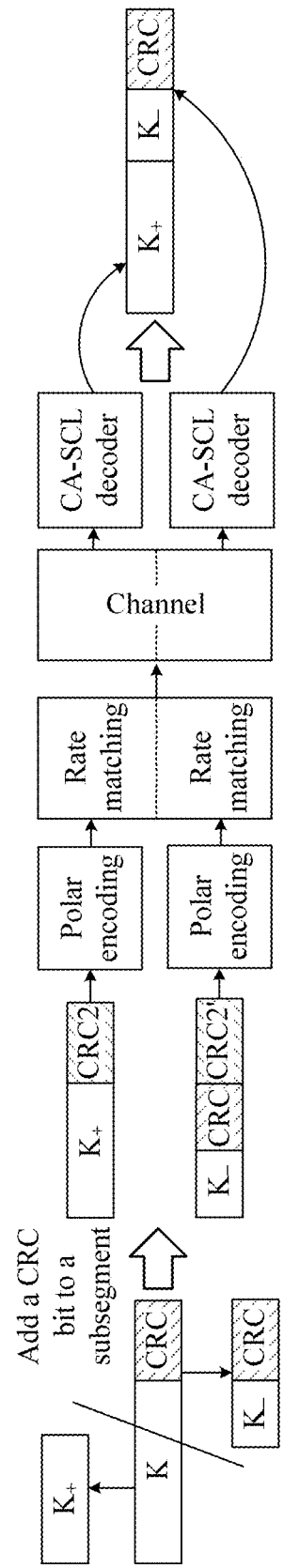
FIG. 9 is a schematic diagram of another embodiment of CA-polar encoding method and decoding method.

FIG. 8 describes a CA-polar segmentation encoding and decoding method. In another embodiment, as shown in FIG. 9, in CA-polar segmentation encoding, to-be-encoded information bits include a common CRC bit used for error check, but do not include a CRC bit used for assisting in SCL decoding. After an information block whose length is $K+L_{CRC}$ is segmented into a subsegment 0 and a subsegment 1, the CRC bit used for assisting in SCL decoding may be segmented into two segments that are respectively added to the subsegment 0 and the subsegment 1, and independent encoding is performed. If $2^n$ is greater than a maximum mother code length, and a CA-polar code segmentation encoding condition is met, the information block is segmented into two segments, and a length of the sub segment 0 is $K_+$, and a length of the subsegment 1 is $K_-$. CRC bits each with a length $L_{CRC2}$ are added to the subsegment 0 and the subsegment 1 respectively, and polar code segmentation encoding is separately performed by using $(K_++L_{CRC2}, M_+)$ and $(K_-+L_{CRC}+L_{CRC2}, M_-)$, where $K+L_{CRC}=K_++K_-+L_{CRC}$, $M=M_++M_-$, and $L_{CRC}$ is a CRC bit length of CRC bits used for error check, $L_{CRC2}$ is a CRC bit length of CRC bits used for assisting in SCL decoding. If a mother code length of a subsegment is still greater than the maximum mother code length, and the CA-polar code segmentation encoding condition is met, segmentation is continued; otherwise, another rate matching method is used. A receiving end performs de-rate matching, performs independent CA-SCL decoding on the subsegments, to output a decoding result of each subsegment, and finally combines decoding results of the two subsegments.

Figure 10:
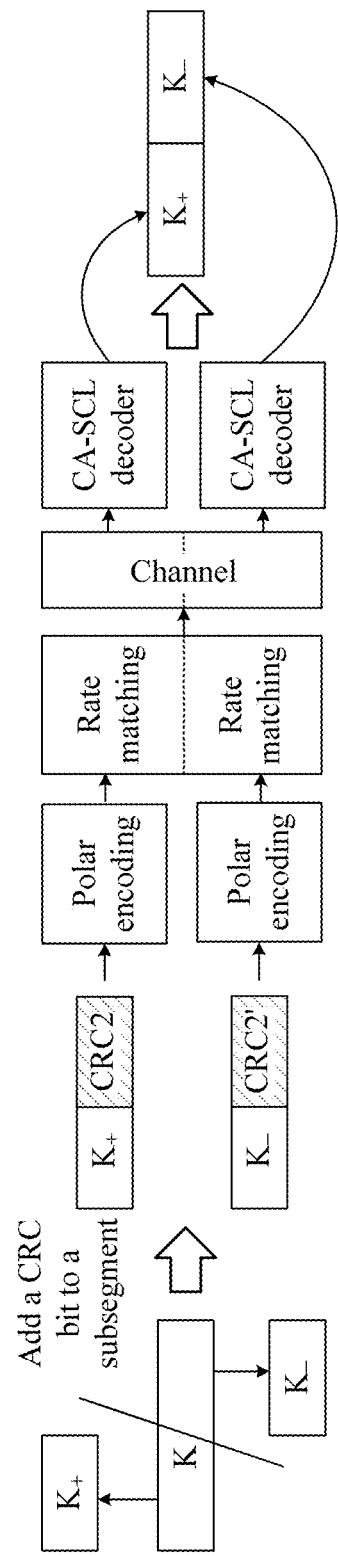
FIG. 10 is a schematic diagram of still another embodiment of CA-polar encoding method and decoding method.

In another embodiment, as shown in FIG. 10, in CA-polar segmentation encoding, to-be-encoded information bits do not include any CRC bit. However, after an information block whose length is K is segmented into a subsegment 0 and a subsegment 1, a CRC bit used for assisting in SCL decoding is segmented into two segments that are respectively added to the subsegment 0 and the subsegment 1, and independent encoding is performed. Therefore, if $2^n$ is greater than a maximum mother code length, and a CA-polar code segmentation encoding condition is met, the information block is segmented into two segments. A length of the subsegment 0 is $K_+$, and a length of the subsegment 1 is $K_-$. CRC bits each with a length $L_{CRC2}$ are respectively added to the subsegment 0 and the subsegment 1, and polar code segmentation encoding is separately performed by using $(K_++L_{CRC2}, M_+)$ and $(K_-+L_{CRC2}, M_-)$, where $K=K_+-K_-$, $M=M_++M_-$, $K_+=\lceil K/2 \rceil$, $K_-=K-K_+$, $M_+=\lceil M/2 \rceil$, $M_-=M-M_+$, and Kc=K. If a mother code length of a subsegment is still greater than the maximum mother code length, and the CA-polar code segmentation encoding condition is met, segmentation is continued. Otherwise, another rate matching method is used. A receiving end performs de-rate matching, performs independent CA-SCL decoding on the subsegments, to output a decoding result of each subsegment, and finally combines decoding results of the two subsegments.

Reference numerals used in method steps described in this application are merely used as marks, and do not indicate an order for performing the steps.

Puncturing described in the embodiments of this application includes quasi-uniform puncturing (QUP). First, it is determined that a mother code length is an integer power of 2 and is greater than or equal to a target code length, and then a puncturing mode (a puncturing position) is determined based on the mother code length and the target code length. The puncturing mode may be represented by using a binary sequence (00 . . . 011 . . . 1), where "0" represents a puncturing position, and "1" indicates a position at which puncturing is not performed. A channel capacity corresponding to the puncturing position is set to 0 (or an error probability is set to 1 or a signal-to-noise ratio SNR is set to infinitesimal), reliabilities of polar channels are calculated by using a density evolution, Gaussian approximation, or linear fitting method, and the polar channels are sorted based on the reliabilities, to determine positions of an information bit and a fixed bit (frozen bit). An encoder side deletes an encoded bit at a puncturing position, to obtain a polar code.

According to a polar code shortening scheme described in this application, it is determined that a mother code length is an integer power of 2 and is greater than or equal to a target code length. An encoded bit at a shortening position is related to only a fixed bit. A process includes: calculating reliabilities of polar channels based on a mother code length, then determining a shortening position, placing a fixed bit on a corresponding polar channel, determining, from remaining polar channels based on the reliabilities, positions of an information bit and a frozen bit (fixed bit), and deleting an encoded bit at the shortening position, to obtain a polar code, so as to implement rate matching. In a shortening-based encoding and rate matching scheme, the reliability of the polar channel does not need to be recalculated based on a shortening position, but the fixed bit is placed on the polar channel corresponding to the shortening position, thereby greatly reducing complexity of polar code construction.

Figure 11:
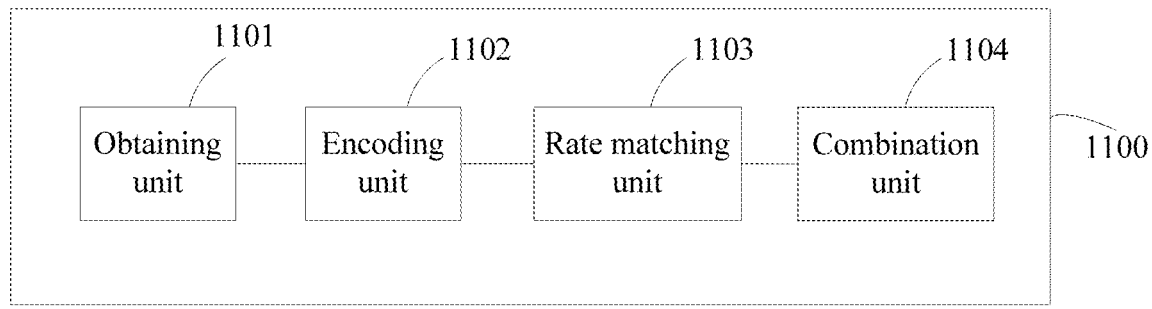
FIG. 11 is a simplified block diagram of a coding apparatus according to an embodiment of this application.

FIG. 11 is a schematic structural diagram of a coding apparatus 1100 according to this application, and the coding apparatus 1100 includes:

an obtaining unit 1101, configured to obtain a to-be-sent information block and a target code length M of a polar code;

an encoding unit 1102, configured to: determine a mother code length N used for polar encoding, when the target code length M is greater than N, if an encoding parameter of the information block meets a preset condition, segment a to-be-encoded information bit sequence into p subsegments, and perform independent polar encoding on the p subsegments, to obtain p encoded bit sequences whose lengths are respectively mother code lengths of the subsegments, where p is an integer greater than or equal to 2;

a rate matching unit 1103, configured to separately perform rate matching on p encoding results, to obtain p encoded bit sequences whose lengths are respectively target code lengths of the subsegments; and a combination unit 1104, configured to combine the p rate-matched encoded bit sequences, to obtain an encoded bit sequence whose length is M.

Optionally, the encoding unit 1102 is further configured to: if the encoding parameter of the information block does not meet the preset condition, perform polar encoding on the to-be-encoded information bit sequence by using the mother code length N, to obtain a first encoded bit sequence whose length is N; and the rate matching unit is configured to repeat at least some bits in the first encoded bit sequence, to obtain an encoded bit sequence whose length is M.

Optionally, the encoding unit 1102 is further configured to: if the target code length M is less than or equal to the mother code length N, perform polar encoding on the to-be-encoded information bit sequence by using the mother code length N, to obtain a second encoded bit sequence; and the rate matching unit is configured to shorten or puncture the second encoded bit sequence, to obtain an encoded bit sequence whose length is M.

Optionally, the encoding unit 1102 is further configured to: if the target code length Mi is greater than the mother code length Ni, and an encoding parameter of a subsegment corresponding to Mi does not meet the preset condition, perform, by using the mother code length Ni, polar encoding on the subsegment corresponding to Mi, to obtain a third encoded bit sequence whose length is Ni; and the rate matching unit is configured to repeat at least some bits in the third encoded bit sequence, to obtain an encoded bit sequence whose length is Mi.

Optionally, the encoding unit 1102 is further configured to: if the target code length Mi is less than or equal to the mother code length Ni, perform, by using the mother code length Ni, polar encoding on a subsegment corresponding to Ki, to obtain a fourth encoded bit sequence; and the rate matching unit is configured to shorten or puncture the fourth encoded bit sequence, to obtain an encoded bit sequence whose length is Mi.

Figure 12:
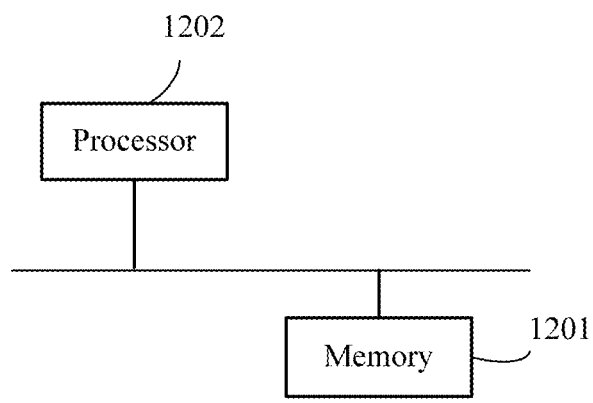
FIG. 12 is a simplified structural diagram of another coding apparatus according to an embodiment of this application.

FIG. 12 is a schematic structural diagram of another coding apparatus 1200 according to this application, and the coding apparatus 1200 includes:

a memory 1201, configured to store a program; and a processor 1202, configured to: execute the program stored in the memory, and when the program is executed, obtain a to-be-sent information block and a target code length M of a polar code; determine a mother code length N used for polar encoding, when the target code length M is greater than N, if an encoding parameter of the information block meets a preset condition, segment a to-be-encoded information bit sequence into p subsegments, and perform independent polar encoding on the p subsegments, to obtain p encoded bit sequences whose lengths are respectively mother code lengths of the subsegments, where p is an integer greater than or equal to 2; separately perform rate matching on p encoding results, to obtain p encoded bit sequences whose lengths are respectively target code lengths of the subsegments; and combine the p rate-matched encoded bit sequences, to obtain an encoded bit sequence whose length is M.

Optionally, the processor 1202 is further configured to: if the encoding parameter of the information block does not meet the preset condition, perform polar encoding on the to-be-encoded information bit sequence by using the mother code length N, to obtain a first encoded bit sequence whose length is N, and repeat at least some bits in the first encoded bit sequence, to obtain an encoded bit sequence whose length is M.

Optionally, the processor 1202 is further configured to: if the target code length M is less than or equal to the mother code length N, perform polar encoding on the to-be-encoded information bit sequence by using the mother code length N, to obtain a second encoded bit sequence, and shorten or puncture the second encoded bit sequence, to obtain an encoded bit sequence whose length is M.

Optionally, a total length of the to-be-encoded information bit sequence is Kc, information bit lengths of the p subsegments are respectively K1, K2, . . . , Kp, the mother code lengths used for performing independent polar encoding on the p subsegments are respectively N1, N2, Np, corresponding target code lengths are respectively M1, M2, . . . , Mp, Kc=K1+K2+ . . . +Kp, M=M1+M2+ . . . +Mp, the to-be-encoded information bit sequence includes the information block, and Kc is greater than or equal to a length K of the information block. The processor 1202 is further configured to: for each Mi, if a target code length Mi of a subsegment corresponding to Mi is greater than a mother code length Ni, and an encoding parameter of a subsegment corresponding to Ki meets the preset condition, further segment the subsegment corresponding to Mi into p subsegments, perform independent encoding and rate matching on the p subsegments, to obtain p corresponding encoded bit sequences, and combine the p encoded bit sequences, to obtain an encoded bit sequence whose target code length is Mi, where i=1, 2, . . . , p.

The coding apparatus in FIG. 12 may further include a transmitter (which is not shown in the figure), configured to transmit the encoded bit sequence that is obtained by the processor and whose length is M.

Figure 13:
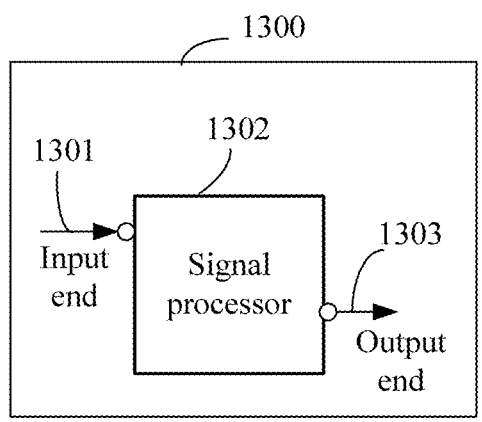
FIG. 13 is a simplified structural diagram of still another coding apparatus according to an embodiment of this application.

FIG. 13 is a schematic structural diagram of still another coding apparatus 1300 according to this application, and the coding apparatus 1300 includes:

at least one input end 1301, configured to receive an information block;

a signal processor 1302, configured to: obtain a to-be-sent information block and a target code length M of a polar code; determine a mother code length N used for polar encoding, when the target code length M is greater than N, if an encoding parameter of the information block meets a preset condition, segment a to-be-encoded information bit sequence into p subsegments, and perform independent polar encoding on the p subsegments, to obtain p encoded bit sequences whose lengths are respectively mother code lengths of the subsegments, where p is an integer greater than or equal to 2; separately perform rate matching on p encoding results, to obtain p encoded bit sequences whose lengths are respectively target code lengths of the subsegments; and combine the p rate-matched encoded bit sequences, to obtain an encoded bit sequence whose length is M; and at least one output end 1303, configured to output the encoded bit sequence obtained by the signal processor.

Optionally, the signal processor 1302 is further configured to: if the encoding parameter of the information block does not meet the preset condition, perform polar encoding on the to-be-encoded information bit sequence by using the mother code length N, to obtain a first encoded bit sequence whose length is N, and repeat at least some bits in the first encoded bit sequence, to obtain an encoded bit sequence whose length is M.

Optionally, the signal processor 1302 is further configured to: if the target code length M is less than or equal to the mother code length N, perform polar encoding on the to-be-encoded information bit sequence by using the mother code length N, to obtain a second encoded bit sequence, and shorten or puncture the second encoded bit sequence, to obtain an encoded bit sequence whose length is M.

Optionally, a total length of the to-be-encoded information bit sequence is Kc, information bit lengths of the p subsegments are respectively K1, K2, . . . , Kp, the mother code lengths used for performing independent polar encoding on the p subsegments are respectively N1, N2, Np, corresponding target code lengths are respectively M1, M2, . . . , Mp, Kc=K1+K2+ . . . +Kp, M=M1+M2+ . . . +Mp, the to-be-encoded information bit sequence includes the information block, and Kc is greater than or equal to a length K of the information block; and the signal processor 1302 is further configured to: for each Mi, if a target code length Mi of a subsegment corresponding to Mi is greater than a mother code length Ni, and an encoding parameter of a subsegment corresponding to Ki meets the preset condition, further segment the subsegment corresponding to Mi into p subsegments, perform independent encoding and rate matching on the p subsegments, to obtain p corresponding encoded bit sequences, and combine the p encoded bit sequences, to obtain an encoded bit sequence whose target code length is Mi, where i=1, 2, . . . , p.

The coding apparatus in FIG. 13 may further include a transmitter (which is not shown in the figure), configured to transmit the encoded bit sequence that is output by the at least one output end and whose length is M.

The coding apparatuses in FIG. 11 to FIG. 13 in this application each may be any device that has a wireless communications function, for example, an access point, a station, user equipment, or a base station. For functions performed by components in the coding apparatuses and a specific execution method, refer to FIG. 2, FIG. 4, FIG. 5, FIG. 8 to FIG. 10, and related descriptions in the embodiments thereof. Details are not described herein again.

Figure 14:
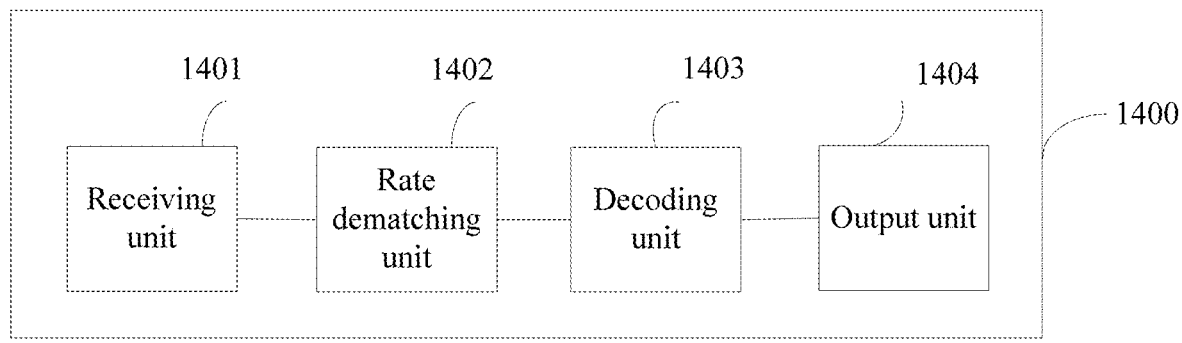
FIG. 14 is a simplified block diagram of a decoding apparatus according to an embodiment of this application.

FIG. 14 is a schematic structural diagram of a decoding apparatus 1400 according to this application, and the decoding apparatus 1400 includes:

a receiving unit 1401, configured to receive log-likelihood ratios LLRs corresponding to to-be-decoded bits, where a length of the to-be-decoded bits is a target code length M used in polar encoding;

a de-rate matching unit 1402, configured to: determine a mother code length N used in encoding, when the target code length M is greater than the mother code length N, if an encoding parameter meets a preset condition, segment the LLRs corresponding to the to-be-decoded bits into p subsegments, and separately perform de-rate matching on the p subsegments, where p is an integer greater than or equal to 2;

a decoding unit 1403, configured to perform independent SCL decoding on LLRs of p de-rate-matched subsegments, to obtain decoding results of the p subsegments; and an output unit 1404, configured to combine the decoding results of the p subsegments, to output a decoded bit sequence.

Figure 15:
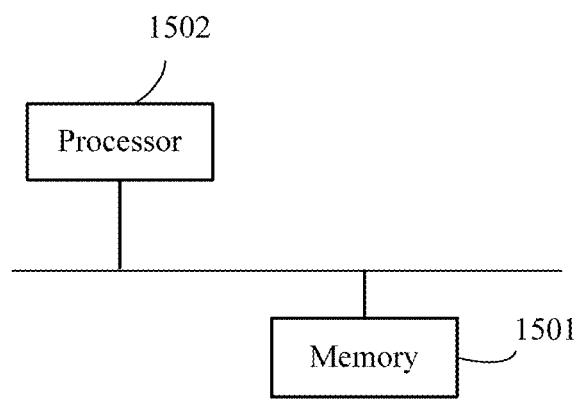
FIG. 15 is a simplified structural diagram of a decoding apparatus according to an embodiment of this application.

FIG. 15 is a schematic structural diagram of a decoding apparatus 1500 according to this application, and the decoding apparatus 1500 includes:

a memory 1501, configured to store a program; and a processor 1502, configured to: execute the program stored in the memory, and when the program is executed, receive log-likelihood ratios LLRs corresponding to to-be-decoded bits, where a length of the to-be-decoded bits is a target code length M used in polar encoding; determine a mother code length N used in encoding, when the target code length M is greater than the mother code length N, if an encoding parameter meets a preset condition, segment the LLRs corresponding to the to-be-decoded bits into p subsegments, and separately perform de-rate matching on the p subsegments; perform independent SCL decoding on LLRs of p de-rate-matched subsegments, to obtain decoding results of the p subsegments; and combine the decoding results of the p subsegments, to output a decoded bit sequence, where p is an integer greater than or equal to 2.

Figure 16:
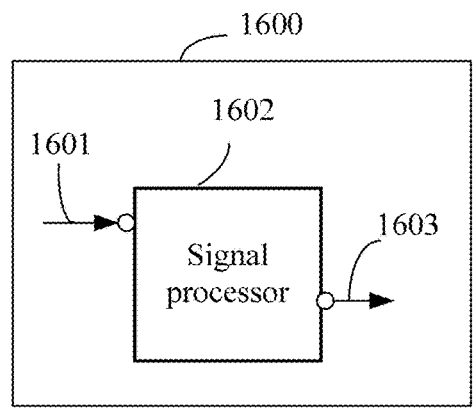
FIG. 16 is a simplified structural diagram of a decoding apparatus 1600 according to an embodiment of this application.

FIG. 16 is a schematic structural diagram of a decoding apparatus 1600 according to this application, and the decoding apparatus 1600 includes:

at least one input end 1601, configured to receive log-likelihood ratios LLRs corresponding to to-be-decoded bits, where a length of the to-be-decoded bits is a target code length M used in polar encoding;

a signal processor 1602, configured to: determine a mother code length N used in encoding, when the target code length M is greater than the mother code length N, if an encoding parameter meets a preset condition, segment the LLRs corresponding to the to-be-decoded bits into p subsegments, and separately perform de-rate matching on the p subsegments; perform independent SCL decoding on LLRs of p de-rate-matched subsegments, to obtain decoding results of the p subsegments; and combine the decoding results of the p subsegments, to output a decoded bit sequence, where p is an integer greater than or equal to 2; and at least one output end 1603, configured to output the decoded bit sequence obtained by the signal processor.

Optionally, mother code lengths used for encoding the p subsegments are respectively N1, N2, Np, target code lengths are respectively M1, M2, Mp, and corresponding information bit lengths are respectively K1, K2, . . . , Kp.

The signal processor 1602 is further configured to: for each Mi, where i=1, 2, . . . , p, if Mi is greater than a mother code length Ni, and an encoding parameter of a subsegment corresponding to Mi meets the preset condition, further segment an LLR sequence of the subsegment corresponding to Mi into p subsegments, separately perform de-rate matching and decoding on the p subsegments, to obtain corresponding decoding results of the p subsegments, and combine the decoding results of the p subsegments, to obtain Ki corresponding information bits.

The signal processor 1602 is further configured to: for each Mi, where i=1, 2, . . . , p, if Mi is greater a mother code length Ni, and an encoding parameter of a subsegment corresponding to Mi does not meet the preset condition, superimpose LLRs at repetition positions, to obtain a de-rate-matched LLR sequence whose length is Ni, and decode the LLR sequence, to obtain a decoding result of the subsegment corresponding to Mi.

Optionally, the signal processor 1602 is further configured to: when the target code length M is less than the mother code length N, restore an LLR at a puncturing or shortening position, to obtain a de-rate-matched LLR sequence whose length is N, and decode the LLR sequence, to obtain a decoded bit sequence.

The decoding apparatuses in FIG. 14 to FIG. 16 in this application each may be any device that has a wireless communications function, for example, an access point, a station, user equipment, or a base station. For functions performed by components in the decoding apparatuses and a specific execution method, refer to FIG. 3 to FIG. 6, FIG. 8 to FIG. 10, and related descriptions in the embodiments thereof. Details are not described herein again.

The coding method or decoding method in this application can be implemented by hardware or a combination of hardware and software. In many cases, a communications apparatus in a communications system has both a sending function and a receiving function, and not only can serve as a transmitting end to send information to a receiving end, but also serve as a receiving end to receive information sent by a transmitting end. Therefore, the communications apparatus has both an encoding function and a decoding function. The communications apparatus may be configured as a general-purpose processing system that is, for example, generally referred to as a chip. The general-purpose processing system includes: one or more microprocessors that provide a processor function, and an external memory that serves as at least a part of a storage medium. All of these components can be connected to another support circuit by using an external bus architecture.

The communications apparatus may include an application-specific integrated circuit (ASIC) having a processor, a bus interface, and a user interface; and at least a part of a storage medium integrated in a single chip. Alternatively, the communications apparatus may include one or more field programmable gate arrays (FPGAs), a programmable logic device (PLD), a controller, a state machine, a logic gate, a discrete hardware component, any other proper circuit, or any combination of circuits capable of performing various functions described throughout this application.

Figure 17:
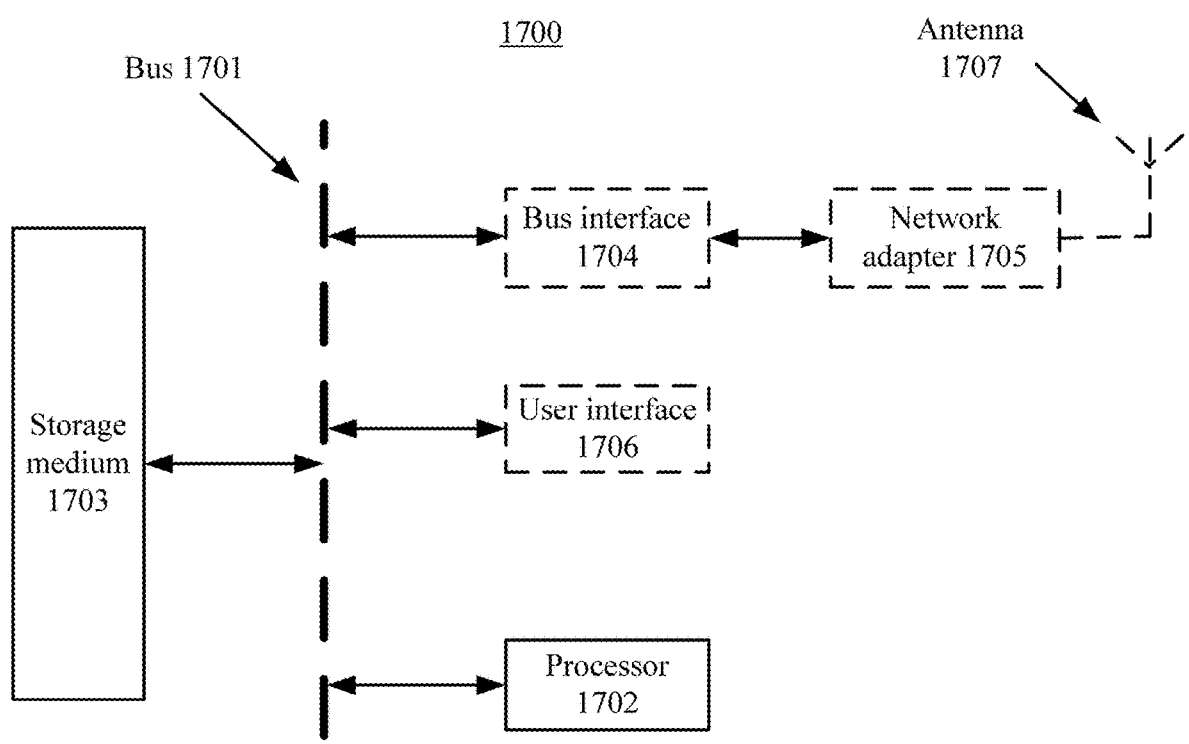
FIG. 17 is a simplified structural diagram of a communications apparatus according to an embodiment of this application.

FIG. 17 is a schematic structural diagram of a communications apparatus 1700 (a communications apparatus such as an access point, a base station, a station, or a terminal) according to an embodiment of this application. As shown in FIG. 17, the communications apparatus 1700 may be implemented by using a bus 1701 as a general bus architecture. Based on specific application and an overall design constraint of the communications apparatus 1700, the bus 1701 may include any quantity of interconnect buses and bridges. The bus 1701 connects various circuits together. These circuits include a processor 1702, a storage medium 1703, and a bus interface 1704. The storage medium 1703 is configured to store an operating system, to-be-sent data, and received data. Optionally, the communications apparatus 1700 connects a network adapter 1705 and the like through the bus 1701 by using the bus interface 1704. The network adapter 1705 may be configured to: implement a signal processing function of a physical layer in a wireless communications network, and send or receive a radio frequency signal by using an antenna 1707. A user interface 1706 may be connected to various user input devices such as a keyboard, a display, a mouse, or a joystick. The bus 1701 may be further connected to various other circuits such as a timing source, a peripheral, a voltage regulator, or a power management circuit. These circuits are well known in the art, and therefore details are not described herein.

The processor 1702 is responsible for managing the bus and performing general processing (including executing software stored in the storage medium 1703). The processor 1702 may be implemented by using one or more general-purpose processors and/or dedicated processors. Examples of a processor include a microprocessor, a microcontroller, a DSP, or another circuit that can execute the software. Software should be interpreted as an instruction, data, or any combination thereof in a broad sense, regardless of whether the software is referred to as software, firmware, middleware, microcode, a hardware description language, or another name.

As shown in FIG. 17, the storage medium 1703 is separate from the processor 1702. However, the storage medium 1703 or any part of the storage medium 1703 may be located external to the communications apparatus 1700. For example, the storage medium 1703 may include a transmission line, a carrier waveform modulated by using data, and/or a computer product separate from a wireless node. These media are all accessible by the processor 1702 by using the bus interface 1704. Alternatively, the storage medium 1703 or any part of the storage medium 1703 may be integrated into the processor 1702, for example, may be a cache and/or a general-purpose register.

The processor 1702 can be configured to perform functions of the processor 1202 in FIG. 12 and the processor 1502 in FIG. 15, and the processor 1702 can perform the coding method and the decoding method described in this application. A process performed by the processor 1702 is not described herein again.

A successive cancellation list SCL decoding algorithm described in the embodiments of this application includes another decoding algorithm that is similar to the SCL decoding algorithm, that provides a plurality of candidate paths, and by using which decoding is performed in order, or an algorithm that is improved based on the SCL decoding algorithm.

The coding apparatus and the decoding apparatus described in the embodiments of this application may be independent devices during actual use, or may be an integrated device, configured to: encode to-be-sent information and then send encoded information, or decode received information.

In the examples described in the embodiments of this application, units and method processes may be implemented by electronic hardware or a combination of computer software and electronic hardware. Whether the functions are performed by hardware or software depends on particular applications and design constraints of the technical solutions. Different methods may be used to implement the described functions for each particular application.

In the several embodiments provided in this application, it should be understood that the disclosed apparatus and method may be implemented in another manner. The described apparatus embodiments are merely examples. For example, the unit division is merely logical function division. During actual implementation, there may be other division manners. For example, a plurality of units or components may be combined or integrated into another system. Some steps in the methods may be ignored or not performed. In addition, mutual couplings or direct couplings or communication connections between the units may be implemented through some interfaces, and these interfaces may be in electronic, mechanical, or another form.

The units described as separate parts may or may not be physically separate, that is, may be located at one position, or may be distributed on a plurality of network units. In addition, function units in the embodiments of this application may be integrated into one processing unit, or each of the units may exist alone physically, or two or more units are integrated into one unit.

All or some of the foregoing embodiments may be implemented by using software, hardware, firmware, or any combination thereof. When being implemented by using software, all or some of the embodiments may be implemented in a form of a computer program product. The computer program product includes one or more computer program instructions. When the computer program instructions are loaded and executed on a computer, all or some of the procedures or functions described in the embodiments of the present application are generated. The computer may be a general-purpose computer, a special-purpose computer, a computer network, or another programmable apparatus. The computer instructions may be stored in a computer readable storage medium, or may be transmitted by using the computer readable storage medium. The computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer readable storage medium may be any available medium accessible by a computer, or a data storage device, such as a server or a data center, integrating one or more available media. The available medium may be a magnetic medium (for example, a floppy disk, a hard disk, a magnetic tape, a USB flash drive, a ROM, or a RAM), an optical medium (for example, a CD or DVD), a semiconductor medium (for example, a solid state disk (SSD)), or the like.

The foregoing embodiments are merely intended for describing the technical solutions of the present application, but not for limiting the present application. Although the present application is described in detail with reference to the foregoing embodiments, modifications to the technical solutions described in the foregoing embodiments, or equivalent replacements to some technical features thereof, may be made without departing from the scope of the technical solutions of the embodiments of the present application.

What is claimed is:

1. A method for processing information, performed by a communication device in a wireless network, comprising:
    obtaining an information bit sequence of Kc bits, wherein the information bit sequence comprises a K-bit information block, Kc is greater than K, and wherein the information bit sequence is to be processed into an encoded bit sequence with a target code length of M, M is greater than 1024;
    segmenting the information bit sequence into p segments when a preset condition is satisfied, wherein p is an integer greater than or equal to 2;
    polar encoding each of the p segments, to obtain p encoded subsequences, wherein an encoded subsequence i of the p encoded subsequences has a length that equals to a mother code length Ni, and i=1, 2, . . . , p;
    rate matching each of the p encoded subsequences, to obtain p rate-matched encoded subsequences, wherein a rate-matched encoded subsequence i of the p rate-matched encoded subsequences has a code length Mi;
    concatenating the p rate-matched encoded subsequences, to obtain an encoded bit sequence, wherein the encoded bit sequence has a code length of M; and
    outputting the encoded bit sequence;
    wherein the preset condition is one of:
    for a given code rate R, Kc is greater than a first preset threshold; or
    for a given code rate R, the target code length M is greater than a second preset threshold.

2. The method according to claim 1, wherein the polar encoding is a cyclic redundancy check (CRC)-aided polar encoding.

3. The method according to claim 2, wherein the first preset threshold is any one of the following:
    for R=1/4, Kc is greater than Kc3, and Kc3 is an integer in an interval [410, 510];
    for R=1/3, Kc is greater than Kc4, and Kc4 is an integer in an interval [470, 495]; or
    for R=2/5, Kc is greater than Kc5, and Kc5 is an integer in an interval [520, 530].

4. The method according to claim 2, wherein the second preset threshold is any one of the following:
    for R=1/4, target code length M is greater than Mt3, and Mt 3 is an integer in an interval [1564, 1724];
    for R=1/3, target code length M is greater than Mt 4, and Mt 4 is an integer in an interval [1353, 1428]; or
    for R=2/5, target code length M is greater than Mt 5, and Mt 5 is an integer in an interval [1253, 1278].

5. The method according to claim 1, wherein p=2.

6. The method according to claim 1, wherein after segmenting the information bit sequence into p segments, lengths of the p segments are respectively K1, K2, . . . , Kp, wherein mother code lengths used for polar encoding each of the p segments are respectively N1, N2, . . . , Np, wherein after rate-matching each of the p encoded subsequences, lengths of the p rate-matched encoded subsequences are respectively M1, M2, . . . , Mp, wherein K=K1+K2+ . . . +Kp, and M=M1+M2+ . . . +Mp.

7. An apparatus, comprising:
    a processor coupled to a memory that stores program instructions which, when executed by the processor, cause the apparatus to:
    obtain an information bit sequence of Kc bits, wherein the information bit sequence comprises a K-bit information block, Kc is greater than K, and wherein the information bit sequence is to be processed into an encoded bit sequence with a target code length of M, M is greater than 1024;
    segment the information bit sequence into p segments when a preset condition is satisfied, wherein p is an integer greater than or equal to 2;
    polar encode each of the p segments, to obtain p encoded subsequences, wherein an encoded subsequence i of the p encoded subsequences has a length that equals to a mother code length Ni, and i=1, 2, . . . , p;
    rate match each of the p encoded subsequences, to obtain p rate-matched encoded subsequences, wherein a rate-matched encoded subsequence i of the p rate-matched encoded subsequences has a code length Mi;
    concatenate the p rate-matched encoded subsequences, to obtain an encoded bit sequence, wherein the encoded bit sequence has a code length of M; and
    output the encoded bit sequence;
    wherein the preset condition is one of:
    for a given code rate R, Kc is greater than a first preset threshold; or
    for a given code rate R, the target code length M is greater than a second preset threshold.

8. The apparatus according to claim 7, wherein polar encode each of the p segments comprises using a cyclic redundancy check (CRC)-aided polar encoding to encode each of the p segments.

9. The apparatus according to claim 8, wherein the first preset threshold is any one of the following:
- for R=1/4, Kc is greater than Kc3, and Kc3 is an integer in an interval [410, 510];
- for R=1/3, Kc is greater than Kc4, and Kc4 is an integer in an interval [470, 495]; or
- for R=2/5, Kc is greater than Kc5, and Kc5 is an integer in an interval [520, 530].

10. The apparatus according to claim 8, wherein the second preset threshold is any one of the following:
- for R=1/4, target code length M is greater than Mt3, and Mt 3 is an integer in an interval [1564, 1724];
- for R=1/3, target code length M is greater than Mt 4, and Mt 4 is an integer in an interval [1353, 1428]; or
- for R=2/5, target code length M is greater than Mt 5, and Mt 5 is an integer in an interval [1253, 1278].

11. The apparatus according to claim 7, wherein p=2.

12. The apparatus according to claim 7, wherein after segmenting the information bit sequence into p segments, lengths of the p segments are respectively K1, K2, ..., Kp, wherein mother code lengths used for polar encoding each of the p segments are respectively N1, N2, ..., Np, wherein after rate-matching each of the p encoded subsequences, lengths of the p rate-matched encoded subsequences are respectively M1, M2, ..., Mp, wherein K=K1+K2+ ... +Kp, and M=M1+M2+ ... +Mp.

13. The apparatus according to claim 7, wherein the apparatus is a terminal device, a component of the terminal device, a base station, or a component of the base station.

14. A microchip comprising one or more integrated circuits that are configured to:
- obtain an information bit sequence of Kc bits, wherein the information bit sequence comprises a K-bit information block, Kc is greater than K, and wherein the information bit sequence is to be processed into an encoded bit sequence with a target code length of M, M is greater than 1024;
- segment the information bit sequence into p segments when a preset condition is satisfied, wherein p is an integer greater than or equal to 2;
- polar encode each of the p segments, to obtain p encoded subsequences, wherein an encoded subsequence i of the p encoded subsequences has a length that equals to a mother code length Ni, and i=1, 2, ..., p;
- rate match each of the p encoded subsequences, to obtain p rate-matched encoded subsequences, wherein a rate-matched encoded subsequence i of the p rate-matched encoded subsequences has a code length Mi;
- concatenate the p rate-matched encoded subsequences, to obtain an encoded bit sequence, wherein the encoded bit sequence has a code length of M; and
- output the encoded bit sequence;

wherein the preset condition is one of:
- for a given code rate R, Kc is greater than a first preset threshold; or
- for a given code rate R, the target code length M is greater than a second preset threshold.

15. The microchip according to claim 14, wherein polar encode each of the p segments comprises using a cyclic redundancy check (CRC)-aided polar encoding to encode each of the p segments.

16. The microchip according to claim 15, wherein the first preset threshold is any one of the following:
- for R=1/4, Kc is greater than Kc3, and Kc3 is an integer in an interval [410, 510];
- for R=1/3, Kc is greater than Kc4, and Kc4 is an integer in an interval [470, 495]; or
- for R=2/5, Kc is greater than Kc5, and Kc5 is an integer in an interval [520, 530].

17. The microchip according to claim 15, wherein the second preset threshold is any one of the following:
- for R=1/4, target code length M is greater than Mt3, and Mt 3 is an integer in an interval [1564, 1724];
- for R=1/3, target code length M is greater than Mt 4, and Mt 4 is an integer in an interval [1353, 1428]; or
- for R=2/5, target code length M is greater than Mt 5, and Mt 5 is an integer in an interval [1253, 1278].

18. The microchip according to claim 14, wherein p=2.

19. The microchip according to claim 14, wherein after segmenting the information bit sequence into p segments, lengths of the p segments are respectively K1, K2, ..., Kp, wherein mother code lengths used for polar encoding each of the p segments are respectively N1, N2, ..., Np, wherein after rate-matching each of the p encoded subsequences, lengths of the p rate-matched encoded subsequences are respectively M1, M2, ..., Mp, wherein K=K1+K2+ ... +Kp, and M=M1+M2+ ... +Mp.

20. The microchip according to claim 14, wherein the one or more integrated circuits comprise:
- an input circuit for obtaining the information bit sequence;
- an output circuit for outputting the encoded bit sequence; and
- one or more processing circuits for segmenting the information bit sequence, polar encoding the segments, rate matching the encoded subsequences, and concatenating the rate-matched encoded subsequences.

* * * * *